(12) United States Patent
Cheng et al.

(10) Patent No.: US 9,159,678 B2
(45) Date of Patent: Oct. 13, 2015

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Li-Hui Cheng, New Taipei (TW); Po-Hao Tsai, Taoyuan County (TW); Jui-Pin Hung, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 59 days.

(21) Appl. No.: 14/082,977

(22) Filed: Nov. 18, 2013

(65) Prior Publication Data

US 2015/0137351 A1    May 21, 2015

(51) Int. Cl.
| | |
|---|---|
| *H01L 23/52* | (2006.01) |
| *H01L 23/00* | (2006.01) |
| *H01L 21/56* | (2006.01) |
| *H01L 23/31* | (2006.01) |
| *H01L 23/482* | (2006.01) |

(52) U.S. Cl.
CPC ............ *H01L 23/562* (2013.01); *H01L 21/565* (2013.01); *H01L 23/3107* (2013.01); *H01L 23/3114* (2013.01); *H01L 23/3157* (2013.01); *H01L 23/482* (2013.01); *H01L 24/19* (2013.01); *H01L 2224/12105* (2013.01); *H01L 2224/16227* (2013.01); *H01L 2924/18162* (2013.01)

(58) Field of Classification Search
CPC ...................................................... H01L 21/565
USPC ........... 438/124, 126, 127, 672; 257/692, 774
See application file for complete search history.

(56) References Cited

U.S. PATENT DOCUMENTS

| | | | | |
|---|---|---|---|---|
| 7,071,573 | B1* | 7/2006 | Lin | 257/778 |
| 7,268,421 | B1* | 9/2007 | Lin | 257/690 |
| 2004/0046238 | A1* | 3/2004 | Hwee et al. | 257/678 |
| 2012/0013000 | A1* | 1/2012 | Haba | 257/737 |
| 2014/0042600 | A1* | 2/2014 | Kim et al. | 257/666 |
| 2015/0014851 | A1* | 1/2015 | Lu et al. | 257/738 |

* cited by examiner

*Primary Examiner* — George Fourson, III
(74) *Attorney, Agent, or Firm* — WPAT, P.C.; Anthony King

(57) ABSTRACT

A semiconductor device includes a die, a conductive post disposed adjacent to the die, and a molding surrounding the conductive post and the die, the molding includes a protruded portion protruded from a sidewall of the conductive post and disposed on a top surface of the conductive post. Further, a method of manufacturing a semiconductor device includes disposing a die, disposing a conductive post adjacent to the die, disposing a molding over the conductive post and the die, removing some portions of the molding from a top of the molding, and forming a recess of the molding above a top surface of the conductive post.

18 Claims, 38 Drawing Sheets

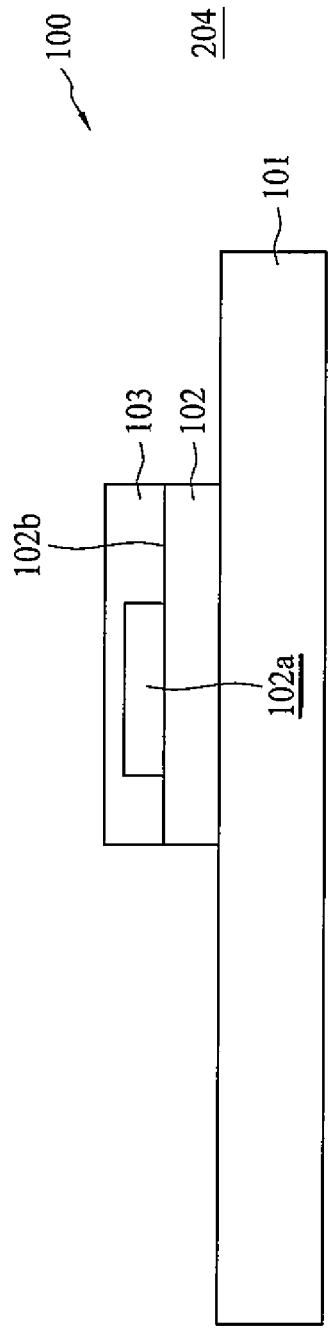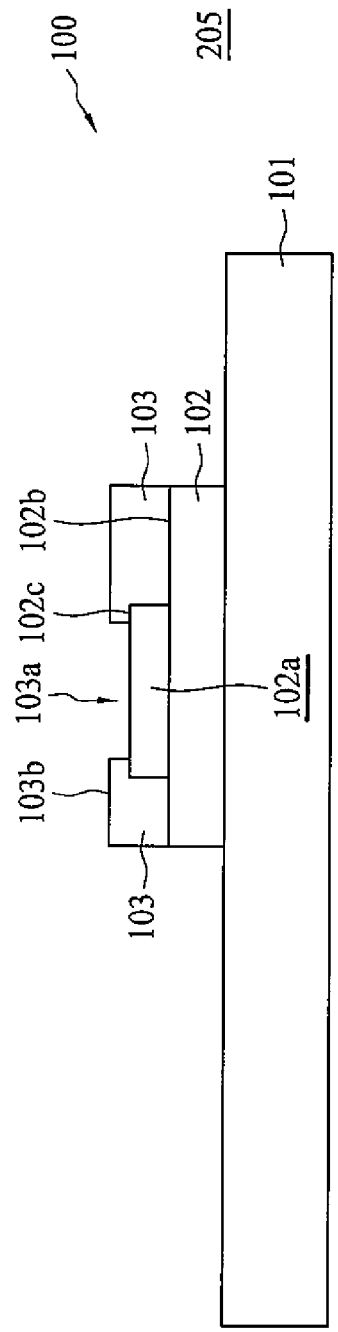

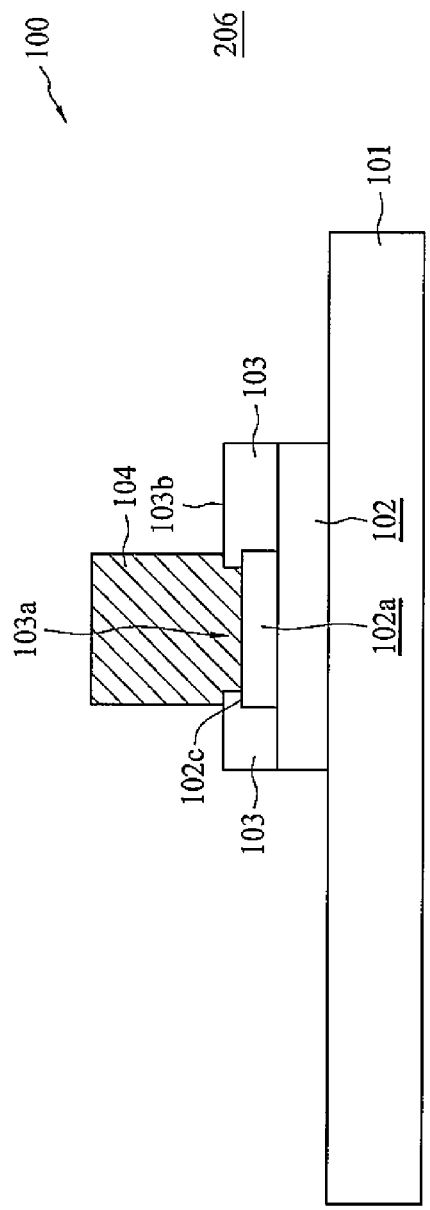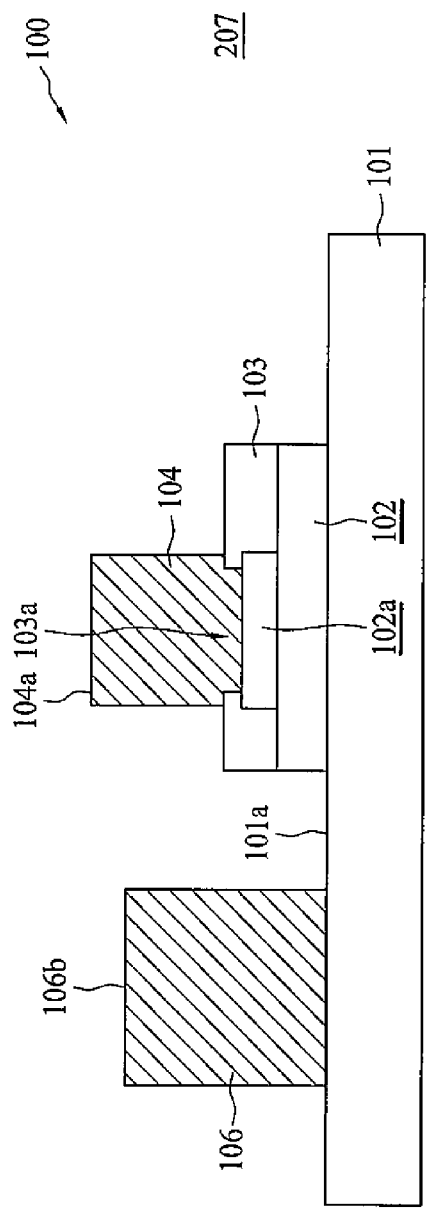
FIG. 7F
FIG. 7G

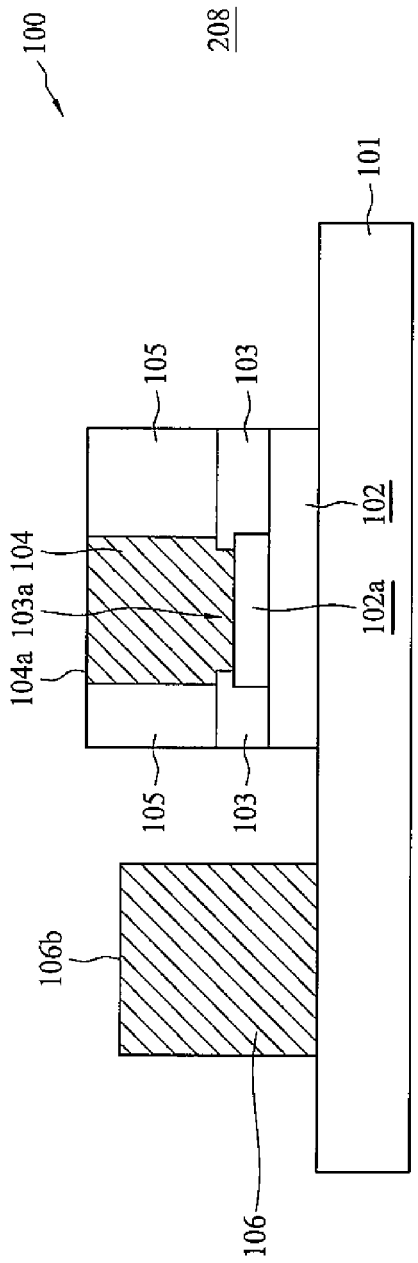
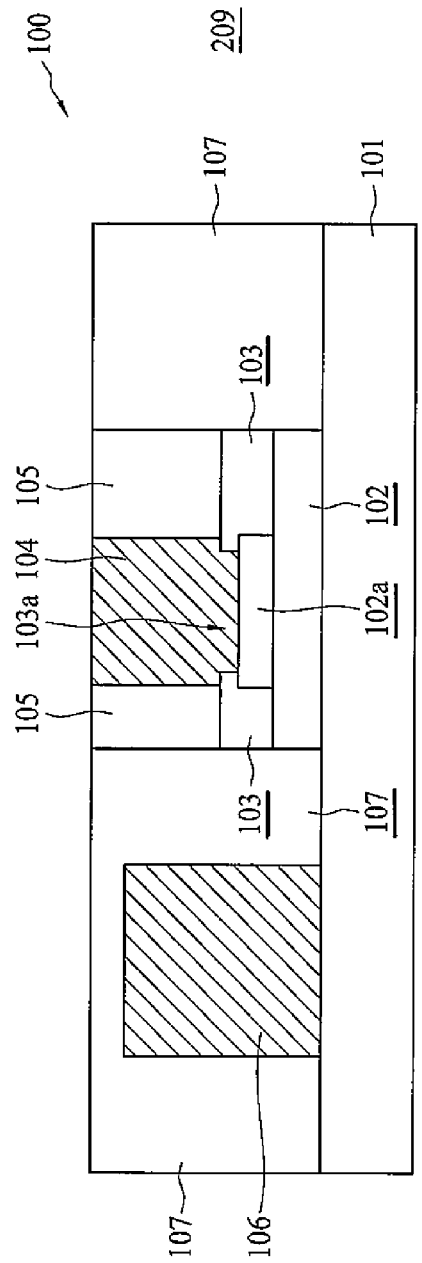
FIG. 7H
FIG. 7I

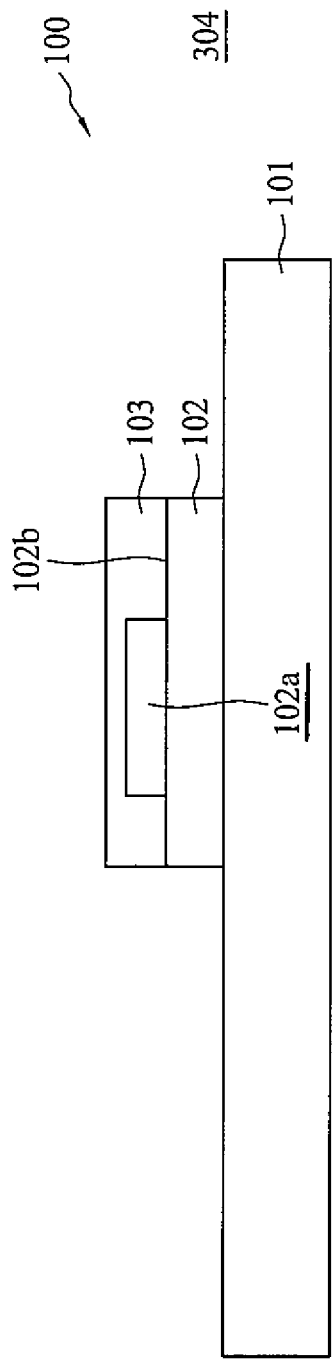
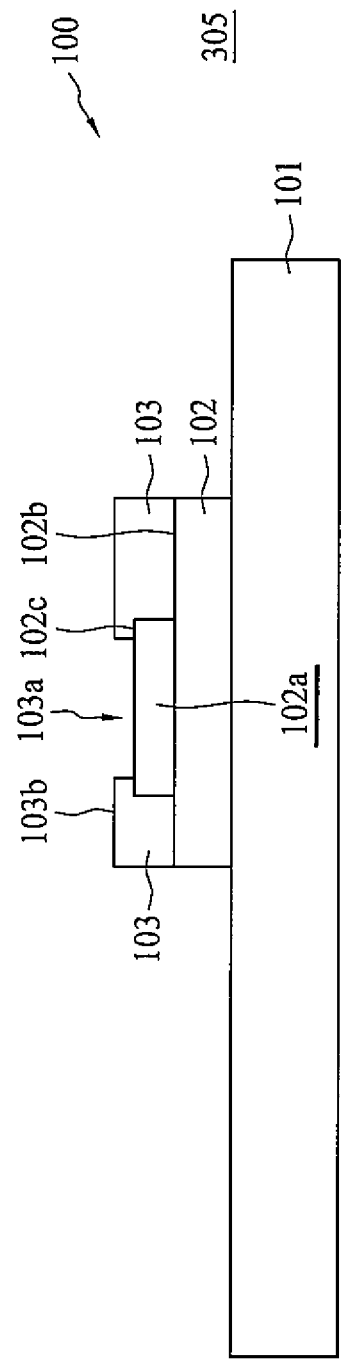
FIG. 8D
FIG. 8E

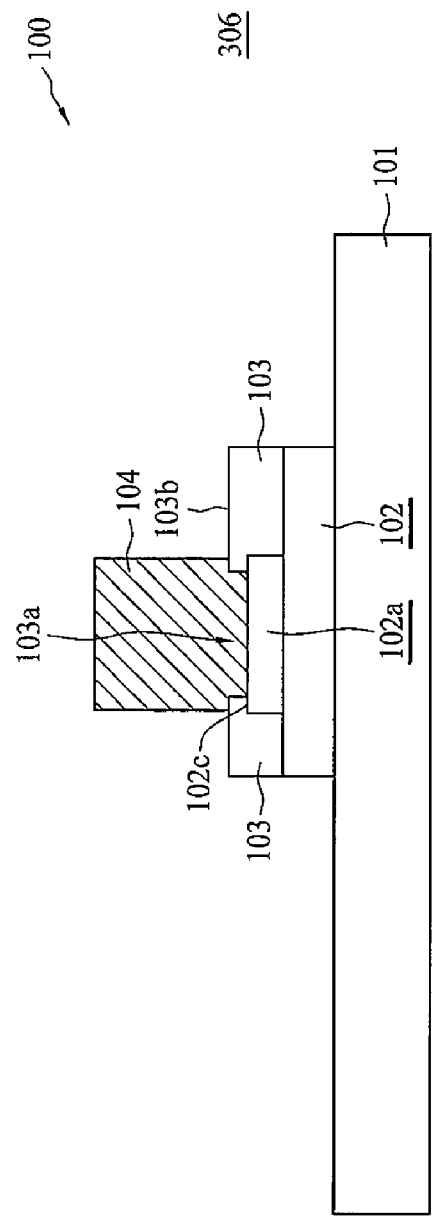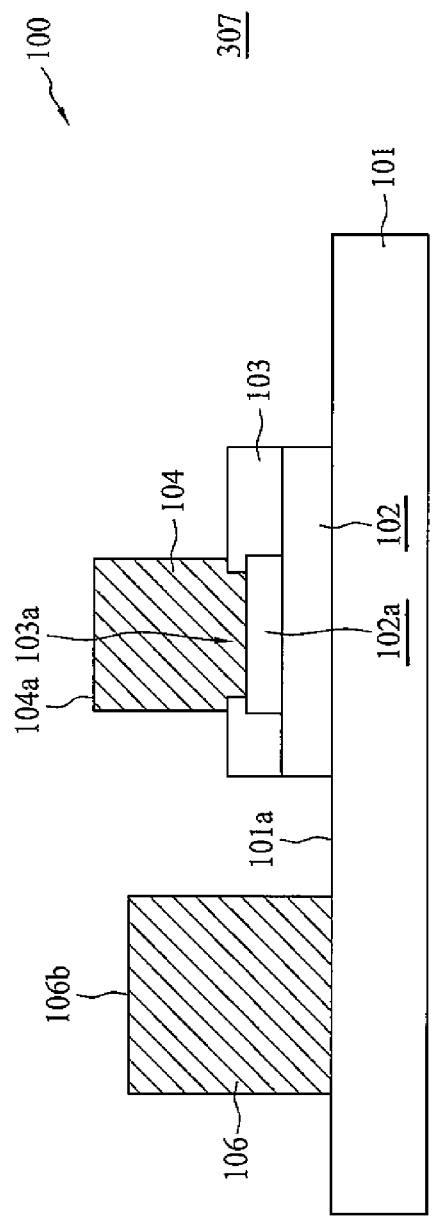
FIG. 8F
FIG. 8G

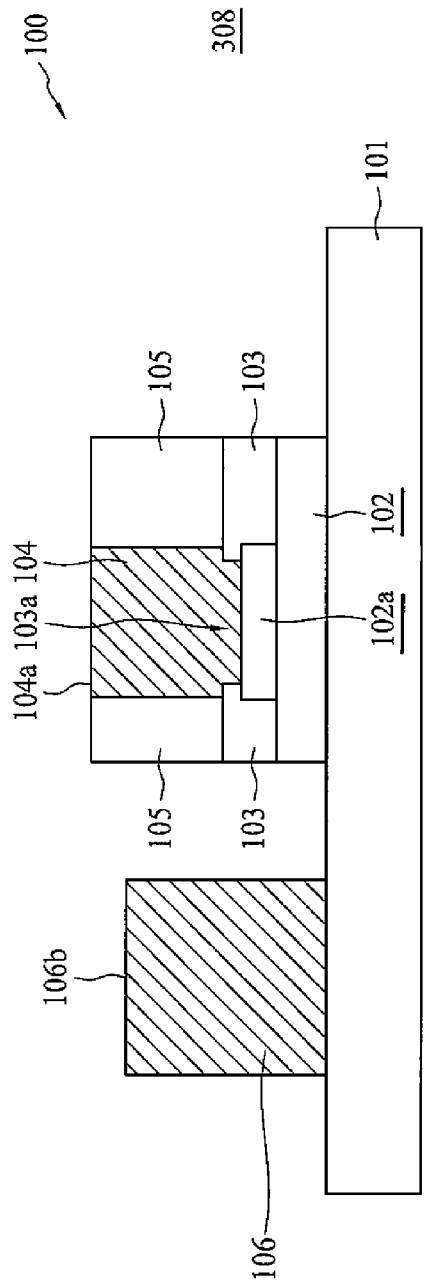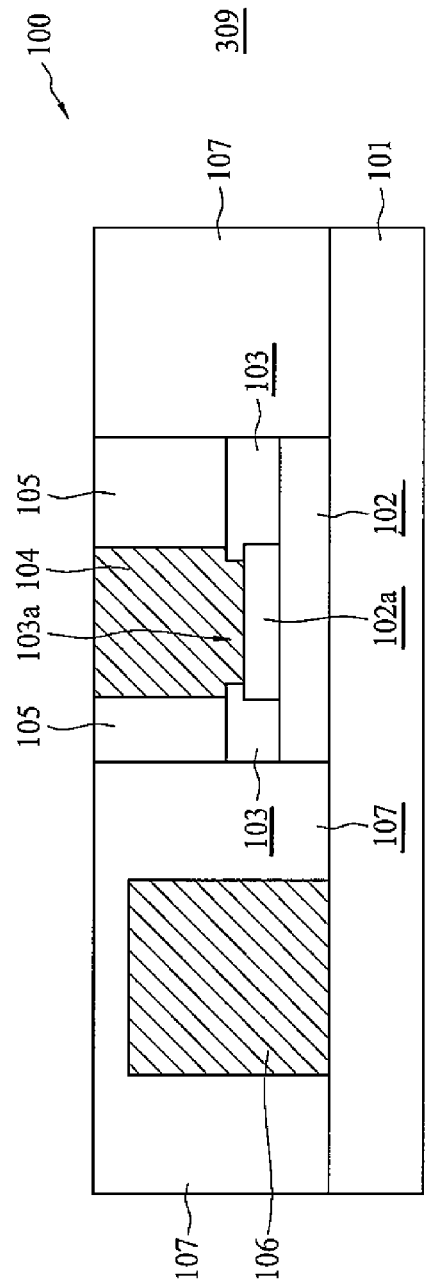

SEMICONDUCTOR DEVICE AND MANUFACTURING METHOD THEREOF

FIELD

The disclosure relates to a semiconductor device and a method of manufacturing a semiconductor device.

BACKGROUND

Electronic equipments involving semiconductor devices are indispensable from our daily life. With the advancement of electronic technology, electronic equipments become more complicated and involve greater amount of integrated circuitry for executing the desired multi-functionality. Thus, manufacturing of the electronic equipment includes more and more operations as well as various kinds of materials in order to produce the semiconductor devices in the electronic equipments. Therefore, there is a continuous demand on simplifying the steps of production, increasing a production efficiency and lowering an associated manufacturing cost on each electronic equipment.

During the operations of manufacturing the semiconductor device, the semiconductor device is assembled with numbers of integrated components including various materials with difference in thermal properties. As such, the integrated components are in undesired configurations after curing of the semiconductor device. The undesired configurations would lead to yield loss of the semiconductor device, poor bondability between the components, development of cracks, delamination of the components or etc. Furthermore, the components of the semiconductor device includes various metallic materials which are in limited quantity and thus in a high cost. The undesired configurations of the components and the yield loss of the semiconductor would further exacerbate materials wastage and thus the manufacturing cost would increase.

As more different components with different materials are involved and a complexity of the manufacturing operations of the semiconductor device is increased, there are more challenges to modify a structure of the semiconductor device and improve the manufacturing operations. As such, there is a continuous need to improve the method for manufacturing the semiconductor and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 7D is a schematic view of a semiconductor device with a passivation in accordance with some embodiments of the present disclosure.

FIG. 7E is a schematic view of a semiconductor device with an opening in accordance with some embodiments of the present disclosure.

FIG. 7F is a schematic view of a semiconductor device with a first conductive post in accordance with some embodiments of the present disclosure.

FIG. 7G is a schematic view of a semiconductor device with a second conductive post in accordance with some embodiments of the present disclosure.

FIG. 7H is a schematic view of a semiconductor device with a first polymer in accordance with some embodiments of the present disclosure.

FIG. 7I is a schematic view of a semiconductor device with a molding in accordance with some embodiments of the present disclosure.

FIG. 8D is a schematic view of a semiconductor device with a passivation in accordance with some embodiments of the present disclosure.

FIG. 8E is a schematic view of a semiconductor device with an opening in accordance with some embodiments of the present disclosure.

FIG. 8F is a schematic view of a semiconductor device with a first conductive post in accordance with some embodiments of the present disclosure.

FIG. 8G is a schematic view of a semiconductor device with a second conductive post in accordance with some embodiments of the present disclosure.

FIG. 8H is a schematic view of a semiconductor device with a first polymer in accordance with some embodiments of the present disclosure.

FIG. 8I is a schematic view of a semiconductor device with a molding in accordance with some embodiments of the present disclosure.

DETAILED DESCRIPTION OF THE INVENTION

Figure 1:
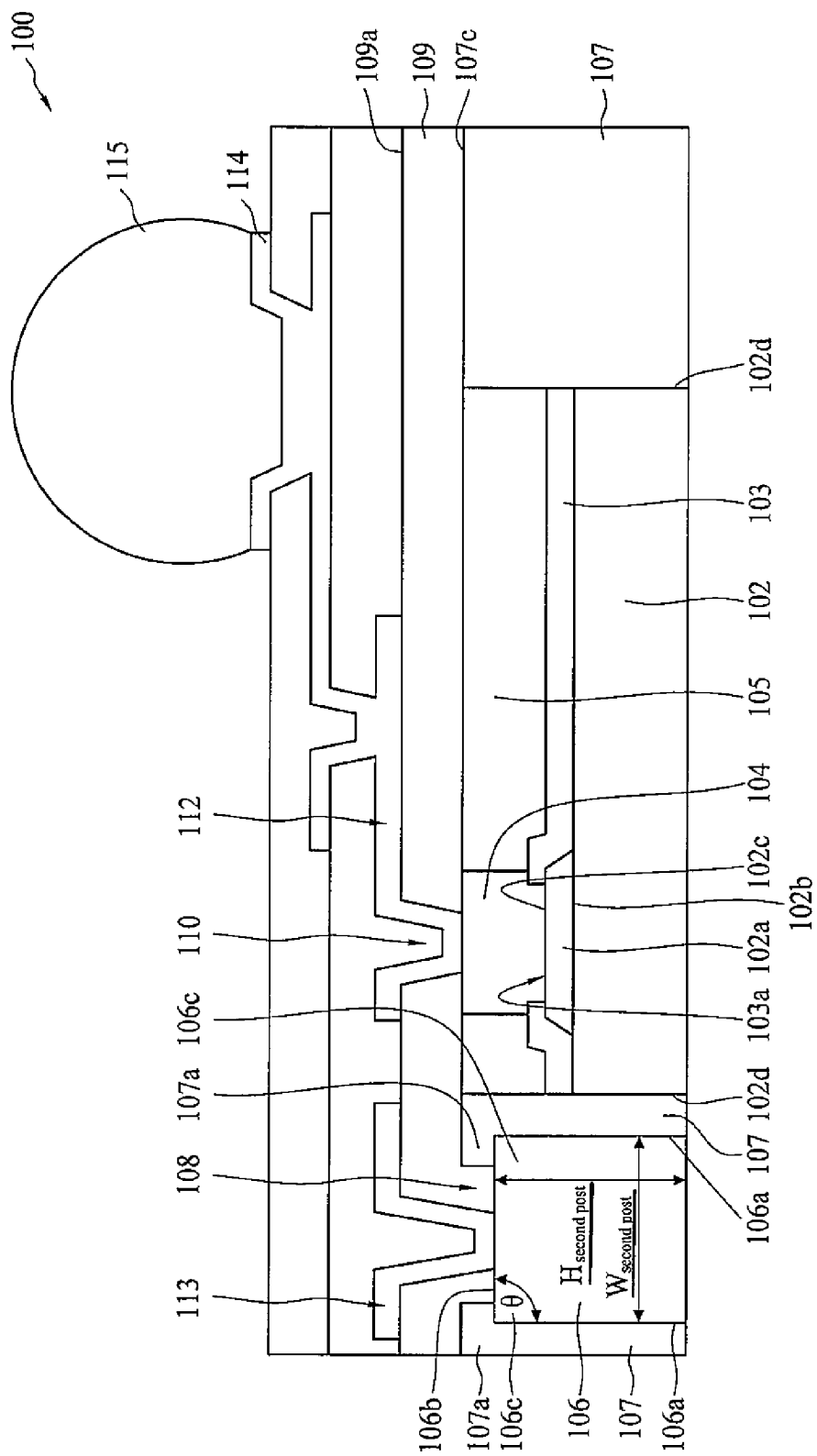
FIG. 1 is a schematic view of a semiconductor device in accordance with some embodiments of the present disclosure.

A semiconductor device is manufactured by a number of operations. During the manufacturing, a die is disposed on a substrate, and several copper pillars are disposed around the die. Those copper pillars are configured for electrically connecting a circuitry within the die with a circuitry external to the die. Each of the copper pillars is surrounded and covered by various kinds of materials for protecting a structure of the copper pillar and an electrical connection between the die and the copper pillar. The copper pillar is surrounded by different materials such as molding compounds, polymer, dielectric material or etc. These materials have different coefficient of thermal expansion (CTE). Such a mismatch of CTE would cause cracks developed within the semiconductor device.

Furthermore, an adhesion strength between the copper pillar and other materials would decrease after curing the semiconductor device. Thus, the cracks can even propagate through the copper pillar during subsequent manufacturing operations. The propagation of the cracks further weakens the electrical connection between the die and the copper pillar and leads to a delamination of components from the semiconductor device after thermal cycling, and ultimately result in a failure of the semiconductor device.

In the present disclosure, a semiconductor device with a structural improvement is disclosed. The semiconductor device includes a molding with a height higher than a copper post in order to surround a periphery of a top surface of the copper post, so as to minimize the copper post interfacing with other materials and thus prevent a development of cracks within the semiconductor device. Furthermore, the molding with higher height can eliminate a problem of under grinding of the copper pillar, and thus ultimately improve a reliability of the semiconductor device.

The manufacturing and use of the embodiments of the present invention are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

FIG. 1 is an embodiment of a semiconductor device 100. In some embodiments, the semiconductor device 100 includes a die 102. In some embodiments, the die 102 is a small piece including semiconductor materials such as silicon, and is fabricated with a predetermined functional circuit within the die 102 produced by photolithography operations. In some embodiments, the die 102 is singulated from a silicon wafer by a mechanical or laser blade. In some embodiments, the die 102 is in a quadrilateral, a rectangular or a square shape.

In some embodiments, the die 102 includes a die pad 102a disposed on a surface 102b of the die 102. In some embodiments, the die pad 102a is electrically connected with a circuitry external to the die 102, so that a circuitry internal to the die 102 electrically connects with the circuitry external to the die 102 through the die pad 102a. In some embodiments, the die pad 102a is configured for electrically coupling with a conductive bump through a conductive trace attached on the die pad 102a, so that the circuitry internal to the die 102 connects with the circuitry external to the die 102 from the die pad 102a to the conductive bump through the conductive trace. In some embodiments, the die pad 102a includes gold, silver, copper, nickel, tungsten, aluminum, palladium and/or alloys thereof.

In some embodiments, a passivation 103 is disposed on the surface 102b of the die 102 and over the die pad 102a. In some embodiments, the passivation 103 surrounds the die pad 102a. In some embodiments, the passivation 103 partially covers a top surface 102c of the die pad 102a. The passivation 103 is configured for providing an electrical insulation and a moisture protection for the die 102, so that the die 102 is isolated from ambient environment. In some embodiments, the passivation 103 is formed with dielectric materials such as spin-on glass (SOG), silicon oxide, silicon oxynitride, silicon nitride or the like. In some embodiments, the passivation 103 is formed with a vapor deposition or a spin coating process.

In some embodiments, the passivation 103 includes an opening 103a above the die pad 102a for exposing a portion of the top surface 102c of the die pad 102a and thus for electrically connecting the die pad 102a with the circuitry external to the die 102 through the conductive trace.

In some embodiments, a first conductive post 104 is disposed over the top surface 102c of the die pad 102a. In some embodiments, the first conductive post 104 is on an exposed portion of the top surface 102c and a portion of the passivation 103 adjacent to the opening 103a. The first conductive post 104 is extended from the exposed portion of the top surface 102c to a top of the semiconductor device 100. In some embodiments, the first conductive post 104 is substantially upright and supported by the die pad 102a.

In some embodiments, the first conductive post 104 is in a cylindrical shape with various cross-sectional shapes such as circular shape, quadrilateral shape or polygonal shape. In addition, a wide variety of materials is selected for the first conductive post 104 such as metal or metal alloy. In some embodiments, the first conductive post 104 includes copper (Cu), gold (Au), platinum (Pt), titanium (Ti), nickel (Ni), aluminum (Al), etc.

In some embodiments, a first polymer 105 is disposed over the passivation 103 and surrounds the first conductive post 104. In some embodiments, the first polymer 105 includes a polymeric material such as epoxy, polyimide, polybenzoxazole (PBO), solder resist (SR), ABF film, and the like.

In some embodiments, a second conductive post 106 is disposed adjacent to the die 102. In some embodiments, the second conductive post 106 is extended upright. In some embodiments, the second conductive post 106 has a width $W_{second post}$ of about 50 um to about 300 um. In some embodiments, the second conductive post 106 has a height$_{second post}$ of about 50 um to about 500 um.

In some embodiments, the second conductive post 106 is in a cylindrical shape with various cross-sectional shapes such as circular shape, quadrilateral shape or polygonal shape. In addition, a wide variety of materials is selected for the second conductive post 106 such as metal or metal alloy. In some embodiments, the second conductive post 106 includes copper (Cu), gold (Au), platinum (Pt), titanium (Ti), nickel (Ni), aluminum (Al), etc.

In some embodiments, a molding 107 surrounds the second conductive post 106 and the die 102. In some embodiments, the molding 107 is disposed adjacent to a sidewall 102d of the die 102. In some embodiments, the molding 107 surrounds the second conductive post 106, couples with a sidewall 106a of the second conductive post 106, and partially covers a top surface 106b of the second conductive post 106. The molding 107 substantially encloses the second conductive post 106. Thus, the top surface 106b of the second conductive post 106 is partially exposed for receiving a conductive trace and electrically connecting with a circuitry external to the semiconductor device 100.

In some embodiments, the molding 107 includes a protruded portion 107a protruded from the sidewall 106a of the second conductive post 106 and disposed on the top surface 106b of the second conductive post 106. In some embodiments, the protruded portion 107a of the molding 107 is extended from the sidewall 106a to partially cover a periphery portion 106c of the second conductive post 106. The protruded portion 107a stands on the periphery portion 106c.

Figure 1A:
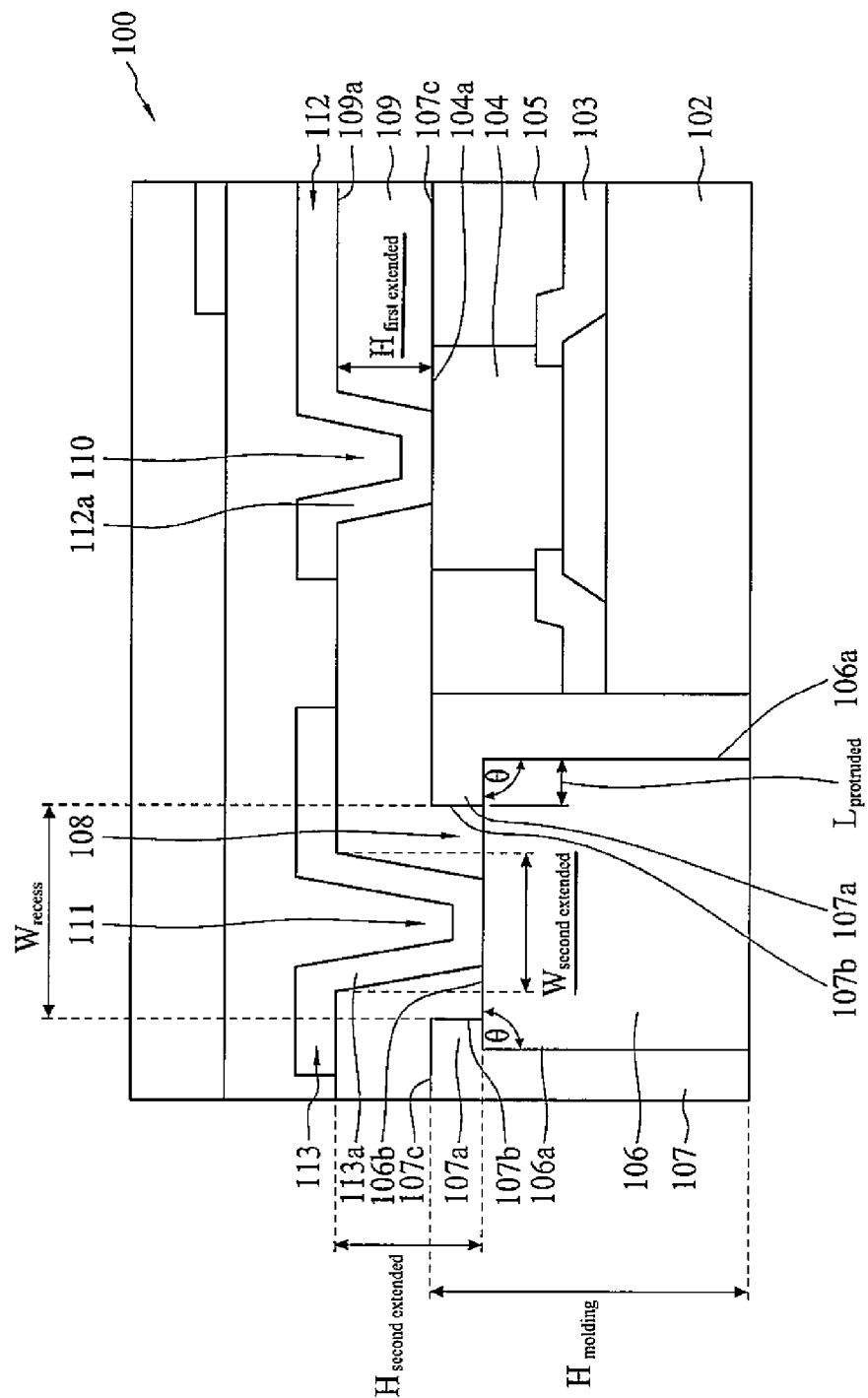
FIG. 1A is an enlarged view of a left part of a semiconductor device of FIG. 1 in accordance with some embodiments of the present disclosure.

FIG. 1A is an enlarged view of a left part of the semiconductor device 100 of FIG. 1. In some embodiments, the protruded portion 107a is in a stepped configuration. In some embodiments, the molding 107 has a top surface 107c which is at a level substantially higher than the top surface 106b of the second conductive post 106. In some embodiments, the molding 107 has a height$_{molding}$ extending to the top surface 107c of the molding 107. In some embodiments, the height$_{molding}$ is about 50 um to about 500 um.

In some embodiments, the protruded portion 107a has a length $L_{protruded}$ which is a shortest straight distance between the sidewall 106a of the second conductive post 106 and a sidewall 107b of the protruded portion 107a. In some embodiments, the length $L_{protruded}$ is about 40 um. In some embodiments, the length $L_{protruded}$ is about 10 um to about 50 um.

In some embodiments, there is an angle θ between the top surface 106b of the second conductive post 106 and the sidewall 106a of the second conductive post 106. The angle θ is interior to the second conductive post 106. In some embodiments, the angle θ is about 30 degrees to about 130 degrees. In some embodiments, the angle θ is 90 degrees, so that the top surface 106b of the second conductive post 106 is a straight planar surface extending in a horizontal direction and is orthogonal to the sidewall 106a of the second conductive post 106.

In some embodiments, the protruded portion 107a of the molding 107 includes a first recessed portion 108 extending from the top surface 107c of the molding 107 towards the top surface 106b of the second conductive post 106. The first recessed portion 108 is disposed above the top surface 106b of the second conductive post 106. In some embodiments, the first recessed portion 108 is configured for receiving a conductive material or a polymeric material. In some embodiments, the first recessed portion 108 has a width $W_{recess}$ between two sidewalls 107b of the protruded portion 107a. In some embodiments, the width $W_{recess}$ is of about 10 um to about 300 um.

In some embodiments, a second polymer 109 is disposed over the molding 107, the first polymer 105 and the second conductive post 106. The second polymer 109 is disposed on the top surface 107c of the molding 107 and the first polymer 105. In some embodiments, the second polymer 109 has a second recessed portion 110 above a top surface 104a of the first conductive post 104.

In some embodiments, the second polymer 109 is disposed on the top surface 106b of the second conductive post 106 and the top surface 107c of the molding 107. In some embodiments, the second polymer 109 includes a third recessed portion 111 above the top surface 106b of the second conductive post 106. The third recessed portion 111 of the second polymer 109 is within the first recessed portion 108 of the molding 107, and is surrounded by the protruded portion 107a of the molding 107.

In some embodiments, the second polymer 109 is disposed within the first recessed portion 108 of the molding 107. In some embodiments, the protruded portion 1017a of the molding 107 surrounds some of the second polymer 109. In some embodiments, the second polymer 109 includes a polymeric material such as epoxy, polyimide, polybenzoxazole (PBO), solder resist (SR), ABF film, and the like.

In some embodiments, the second recessed portion 110 of the second polymer 109 is configured for receiving a first redistribution layer (RDL) 112. In some embodiments, the first RDL 112 is disposed on the first conductive post 104 to electrically connect the first conductive post 104 with the circuitry external to the semiconductor device 100. In some embodiments, the first RDL 112 includes a first extended portion 112a coupled with the top surface 104a of the first conductive post 104. The first extended portion 112a is disposed on the first conductive post 104. In some embodiments, the first extended portion 112a is surrounded by the second polymer 109 and is within the second recessed portion 110.

In some embodiments, the third recessed portion 111 of the second polymer 109 is configured for receiving a second redistribution layer (RDL) 113. In some embodiments, the second RDL 113 is disposed on the second conductive post 106 to electrically connect the second conductive post 106 with the circuitry external to the semiconductor device 100. In some embodiments, the second RDL 113 includes a second extended portion 113a coupled with the top surface 106b of the second conductive post 106. The second extended portion 113a is disposed on the second conductive post 106. In some embodiments, the second extended portion 113a is surrounded by the second polymer 109. In some embodiments, the second extended portion 113a is within the first recessed portion 108 of the molding 107 and the third recessed portion 111 of the second polymer 109.

In some embodiments, the first extended portion 112a of the first RDL 112 has a height $H_{first\ extended}$ from the top surface 104a of the first conductive post 104 to a top surface 109a of the second polymer 109. In some embodiments, the second extended portion 113a of the second RDL 113 has a height $H_{second\ extended}$ from the top surface 106b of the second conductive post 106 to the top surface 109a of the second polymer 109. In some embodiments, the height $H_{second\ extended}$ of the second extended portion 113a is substantially greater than the height $H_{first\ extended}$ of the first extended portion 112a.

In some embodiments, the second extended portion 113a of the second RDL 113 has a width $W_{second\ extended}$ which is a longest straight distance from one side to another of the second extended portion 113a. In some embodiments, the width $W_{second\ extended}$ of the second extended portion 113a is substantially smaller than the width $W_{second\ post}$ of the second conductive post 106 (refers to FIG. 1).

In some embodiments, the top surface 104a of the first conductive post 104 is at a level substantially higher than the top surface 106b of the second conductive post 106. In some embodiments, the top surface 104a of the first conductive post 104 is at a level substantially equal to or higher than the top surface 107c of the molding 107. In some embodiments, the top surface 107c of the molding 107 is at a level substantially higher than the top surface 106b of the second conductive post 106.

In some embodiments as in FIG. 1, the first RDL 112 and the second RDL 113 are electrically connected with the circuitry external to the semiconductor device 100 through a bond pad 114 and a bump 115. In some embodiments, the bond pad 114 is an under bump metallurgy (UBM) pad 114 which is a solderable surface for receiving the bump 115. In some embodiments, the bump 115 is a solder bump, solder ball, solder paste or etc.

Figure 2:
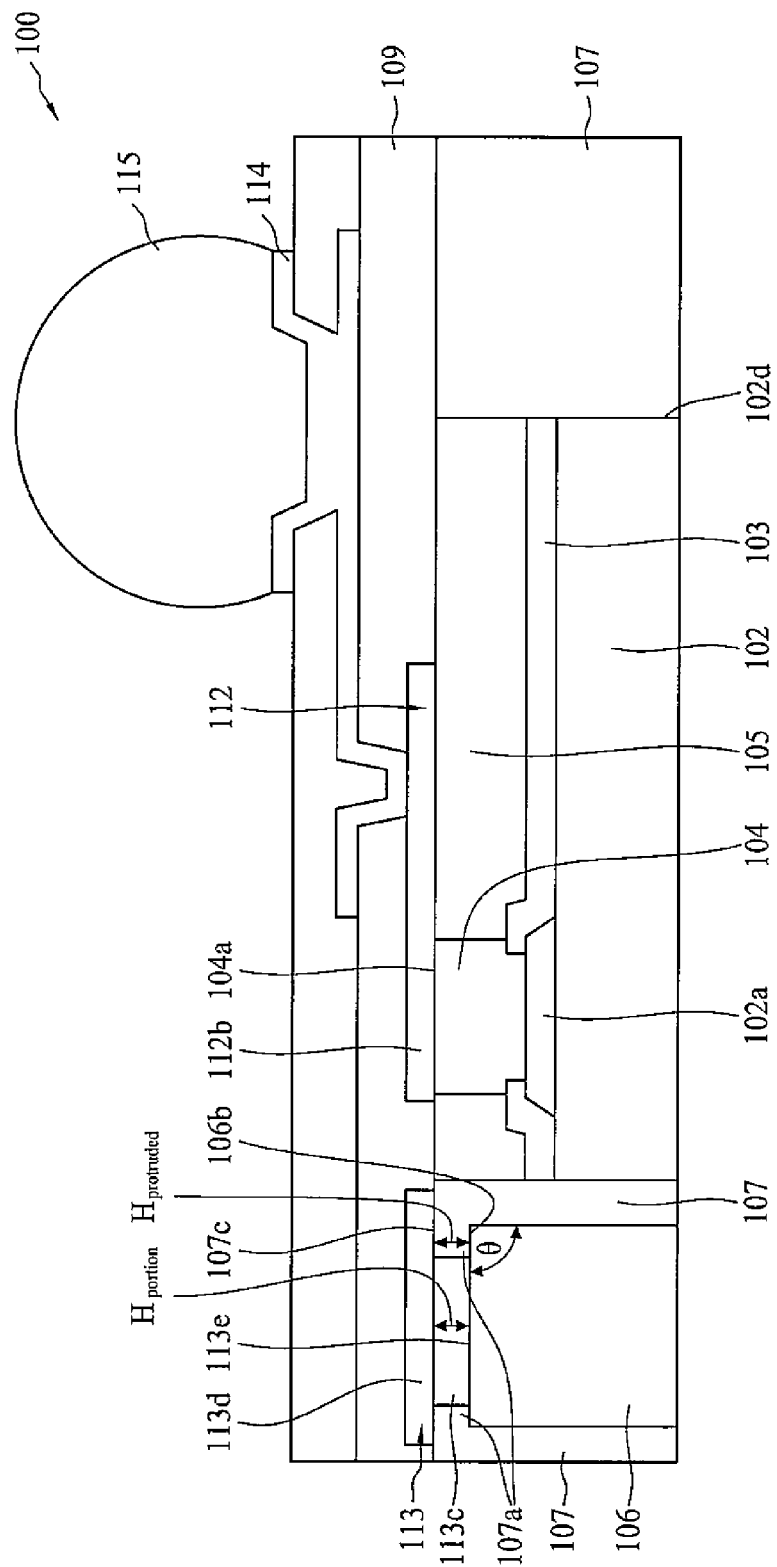
FIG. 2 is a schematic view of a semiconductor device with a portion of a second redistribution layer (RDL) surrounded by a protruded portion of a molding in accordance with some embodiments of the present disclosure.

FIG. 2 is an embodiment of a semiconductor device 100. The semiconductor device 100 includes a die 102, a die pad 102a, a passivation 103, a molding 107, a first conductive post 104, a second conductive post 106, a first polymer 105, a bond pad 114 and a bump 115, which are in similar structural configuration as in FIG. 1.

In some embodiments, the semiconductor device 100 includes a first redistribution layer (RDL) 112. In some embodiments, the first RDL 112 is disposed on the first polymer 105 and the first conductive post 104. In some embodiments, the first RDL 112 does not have an extended portion extending within a second polymer 109 compared with the semiconductor device of FIG. 1, as the first conductive post 104 has sufficient height to directly couple with the first RDL 112. In some embodiments, an end portion 112b of the first RDL is contacted and attached with a top surface 104a of the first conductive post.

In some embodiments, a protruded portion 107a of the molding 107 surrounds a portion 113c of a second redistribution layer (RDL) 113. In some embodiments, the portion 113c of the second RDL 113 is configured for electrically coupling with the second conductive post 106. In some embodiments, the portion 113c is extended from a top surface 107c of the molding 107c to a top surface 106b of the second conductive post 106. In some embodiments, the portion 113c of the second RDL 113 fills a spacing between the protruded portion 107a of the molding 107.

In some embodiments, the portion 113c is a block in a rectangular or quadrilateral shape. The portion 113c is not surrounded by any polymer or polymeric material, which is different from a structure of the semiconductor device as in FIG. 1. In some embodiments, the portion 113c is coupled with an elongated portion 113d of the second RDL 113. In some embodiments, the elongated portion 113d is disposed on the top surface 107c of the molding 107 and the portion 113c. In some embodiments, the elongated portion 113d is disposed within the second polymer 109.

In some embodiments, the portion 113c is centrally disposed underneath the elongated portion 113d, so that the second RDL 113 is symmetric and is in a T shape. In some embodiments, a height $H_{portion}$ of the portion 113c of the second RDL 113 is substantially equal to a height $H_{protruded}$ of the protruded portion 107a of the molding 107, so that the top surface 104a of the first conductive post 104 is in a substantially same level as a top surface 113e of the portion 113c of the second RDL 113. The height $H_{protruded}$ of the protruded portion 107a compensates the height $H_{portion}$ of the portion 113c. Thus, the end portion 112b of the first RDL 112 is also at substantially same level as the elongated portion 113d of the second RDL 113, and both the end portion 112b and the elongated portion 113d are disposed within the second polymer 109.

Figure 3:
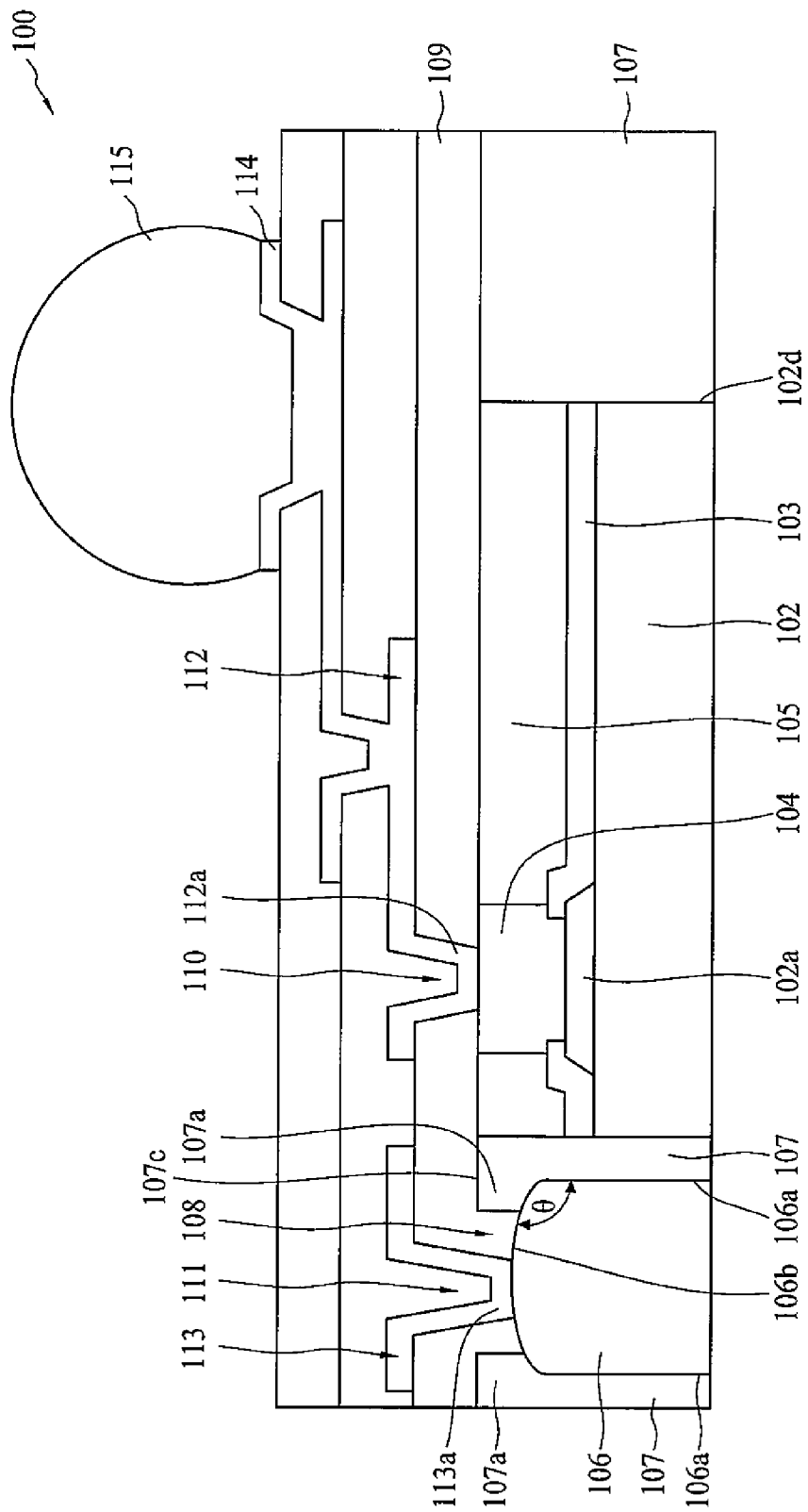
FIG. 3 is a schematic view of a semiconductor device with a top surface of a second conductive post in a convex shape in accordance with some embodiments of the present disclosure.

FIG. 3 is an embodiment of a semiconductor device 100. The semiconductor device 100 includes a die 102, a die pad 102a, a passivation 103, a molding 107, a protruded portion 107a, a first conductive post 104, a second conductive post 106, a first polymer 105, a second polymer 109, a first RDL 112, a second RDL 113, a first extended portion 112a, a second extend portion 113a, a first recessed portion 108, a second recessed portion 110, a third recessed portion 111, a bond pad 114 and a bump 115, which are in similar structural configuration as in FIG. 1.

In some embodiments, the second extended portion 113a is coupled with a top surface 106b of the second conductive post 106. In some embodiments, there is an angle θ between the top surface 106b of the second conductor post 106 and a sidewall 106a of the second conductive post 106. The angle θ is interior to the second conductive post 106. In some embodiments, the angle θ is greater than 90 degrees, so that the top surface 106b of the second conductive post 106 is in a convex shape towards a top surface 107c of the molding 107. In some embodiments, the angle θ is about 100 degrees to about 130 degrees.

Figure 4:
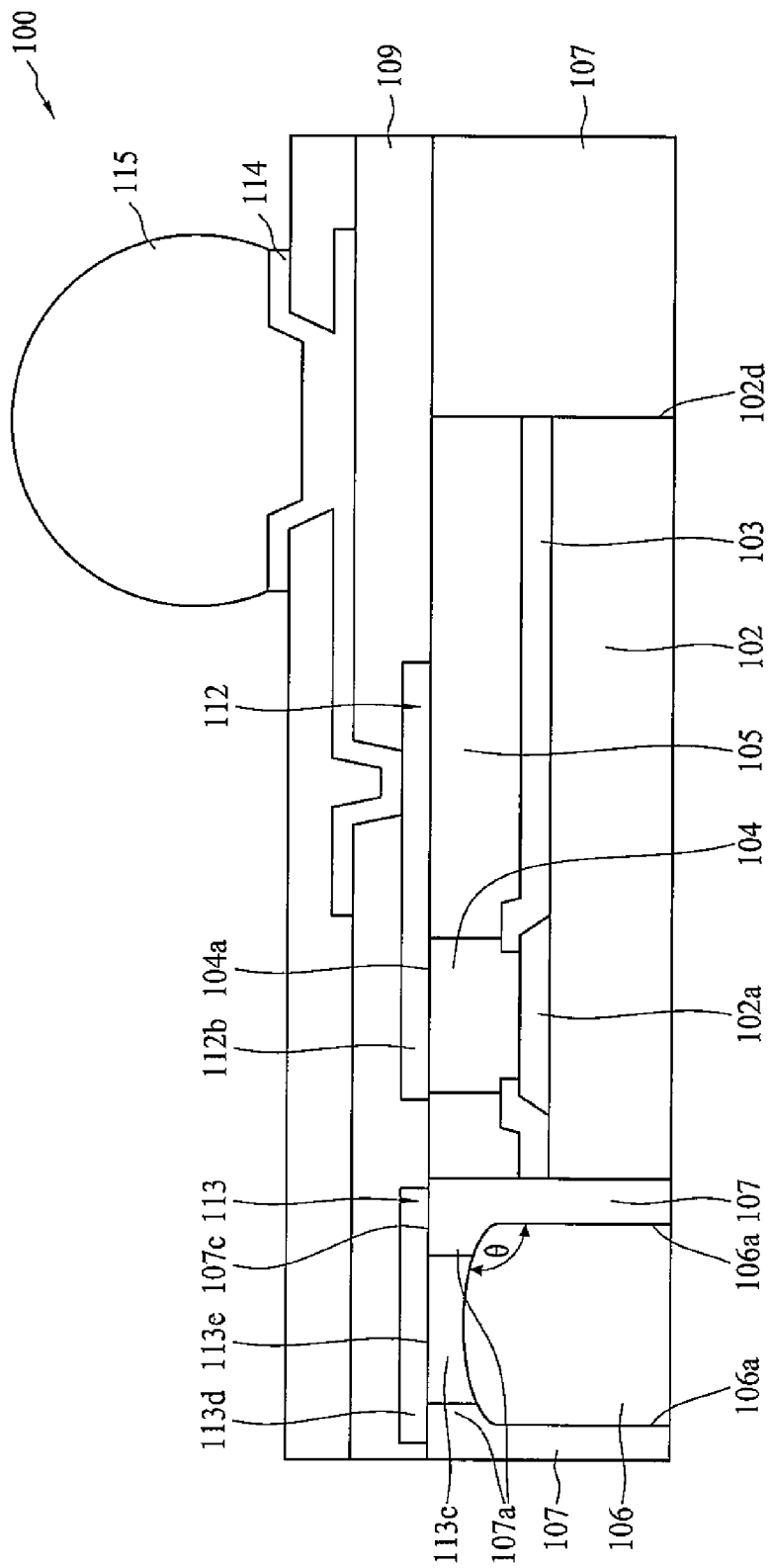
FIG. 4 is a schematic view of a semiconductor device with a top surface of a second conductive post in a convex shape in accordance with some embodiments of the present disclosure.

FIG. 4 is an embodiment of a semiconductor device 100. The semiconductor device 100 includes a die 102, a die pad 102a, a passivation 103, a molding 107, a protruded portion 107a, a first conductive post 104, a second conductive post 106, a first polymer 105, a second polymer 109, a first RDL 112, an end portion 112b, a second RDL 113, an elongated portion 113d, a portion 113c, a bond pad 114 and a bump 115, which are in similar structural configuration as in FIG. 2.

In some embodiments, the portion 113c is coupled with a top surface 106b of the second conductive post 106. In some embodiments, there is an angle θ between the top surface 106b of the second conductor post 106 and a sidewall 106a of the second conductive post 106. The angle θ is interior to the second conductive post 106. In some embodiments, the angle θ is greater than 90 degrees, so that the top surface 106b of the second conductive post 106 is in a convex shape towards a top surface 107c of the molding 107. In some embodiments, the angle θ is about 100 degrees to about 130 degrees.

Figure 5:
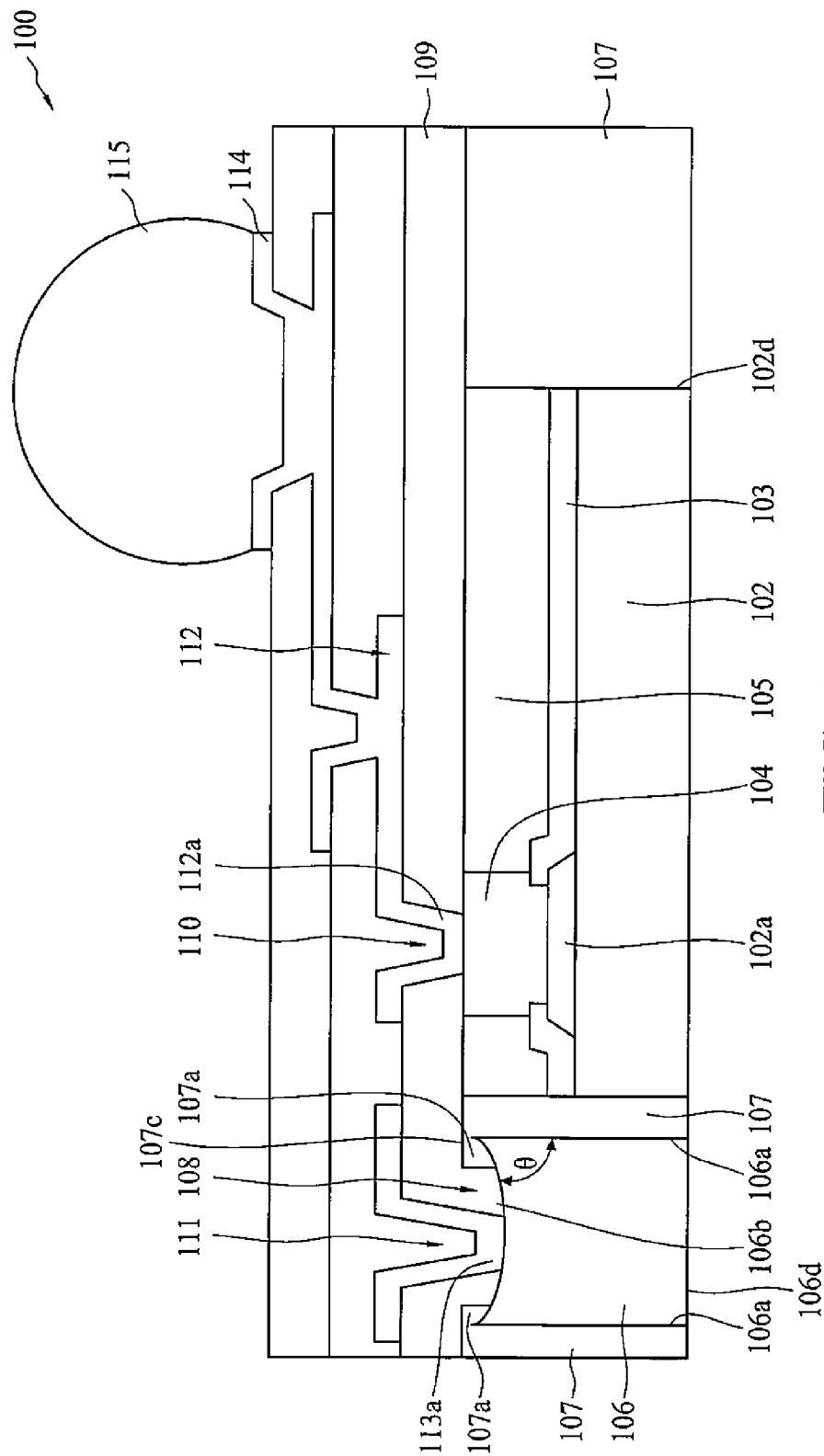
FIG. 5 is a schematic view of a semiconductor device with a top surface of a second conductive post in a concave shape in accordance with some embodiments of the present disclosure.

FIG. 5 is an embodiment of a semiconductor device 100. The semiconductor device 100 includes a die 102, a die pad 102a, a passivation 103, a molding 107, a protruded portion 107a, a first conductive post 104, a second conductive post 106, a first polymer 105, a second polymer 109, a first RDL 112, a second RDL 113, a first extended portion 112a, a second extend portion 113a, a first recessed portion 108, a second recessed portion 110, a third recessed portion 111, a bond pad 114 and a bump 115, which are in similar structural configuration as in FIG. 1 or 3.

In some embodiments, the second extended portion 113a is coupled with a top surface 106b of the second conductive post 106. In some embodiments, there is an angle θ between the top surface 106b of the second conductor post 106 and a sidewall 106a of the second conductive post 106. The angle θ is interior to the second conductive post 106. In some embodiments, the angle θ is less than 90 degrees, so that the top surface 106b of the second conductive post 106 is in a concaved shape towards a bottom surface 106d of the second conductive post 106. In some embodiments, the angle θ is about 20 degrees to about 80 degrees.

Figure 6:
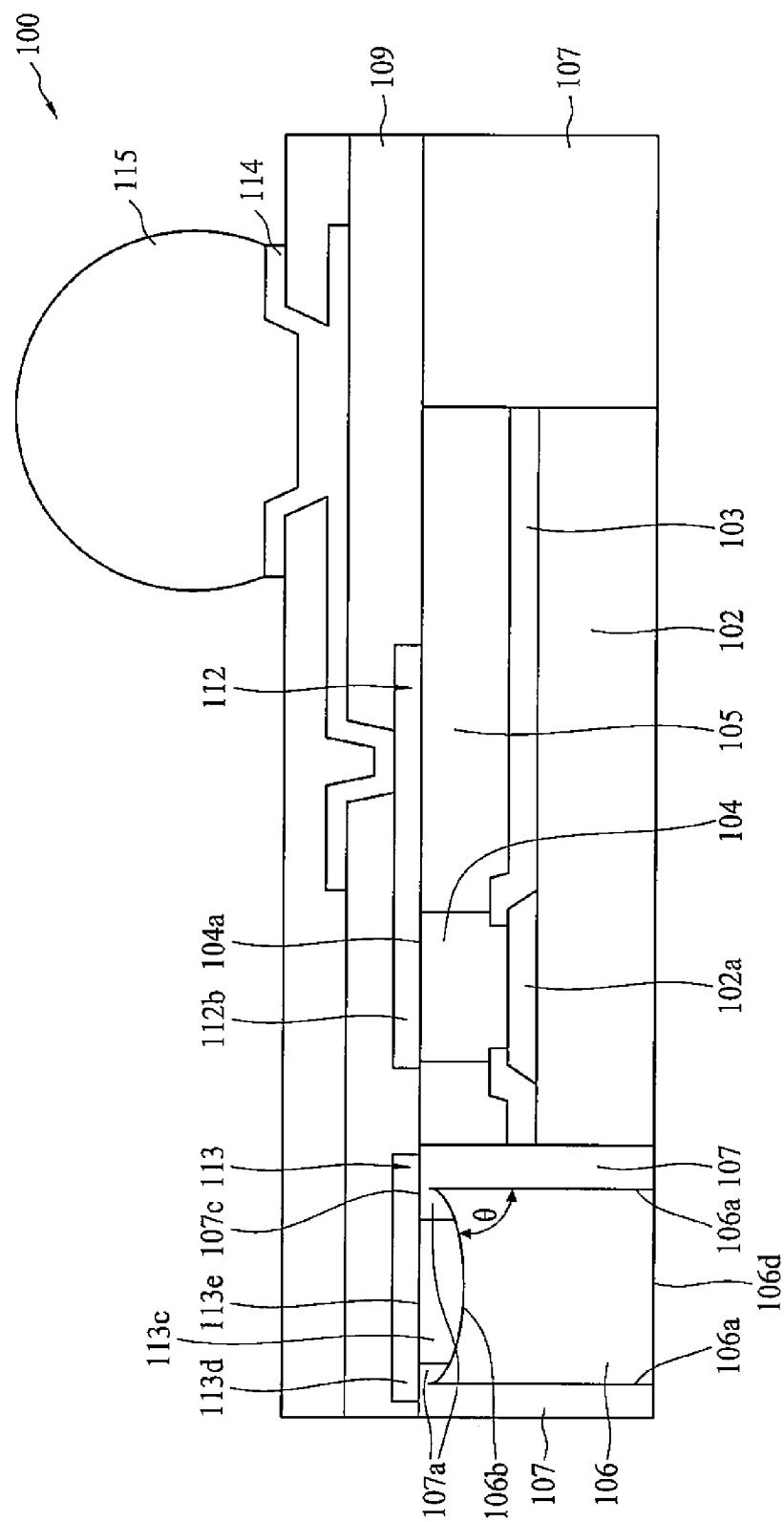
FIG. 6 is a schematic view of a semiconductor device with a top surface of a second conductive post in a concave shape in accordance with some embodiments of the present disclosure.

FIG. 6 is an embodiment of a semiconductor device 100. The semiconductor device 100 includes a die 102, a die pad 102a, a passivation 103, a molding 107, a protruded portion 107a, a first conductive post 104, a second conductive post 106, a first polymer 105, a second polymer 109, a first RDL 112, an end portion 112b, a second RDL 113, an elongated portion 113d, a portion 113c, a bond pad 114 and a bump 115, which are in similar structural configuration as in FIG. 2 or 4.

In some embodiments, the portion 113c is coupled with a top surface 106b of the second conductive post 106. In some embodiments, there is an angle θ between the top surface 106b of the second conductor post 106 and a sidewall 106a of the second conductive post 106. The angle θ is interior to the second conductive post 106. In some embodiments, the angle θ is less than 90 degrees, so that the top surface 106b of the second conductive post 106 is in a concaved shape towards a bottom surface 106d of the second conductive post 106. In some embodiments, the angle θ is about 20 degrees to about 80 degrees.

In the present disclosure, a method of manufacturing a semiconductor device is also disclosed. In some embodiments, a semiconductor device is formed by a method 200. The method 200 includes a number of operations and the description and illustration are not deemed as a limitation as the sequence of the operations.

Figure 7:
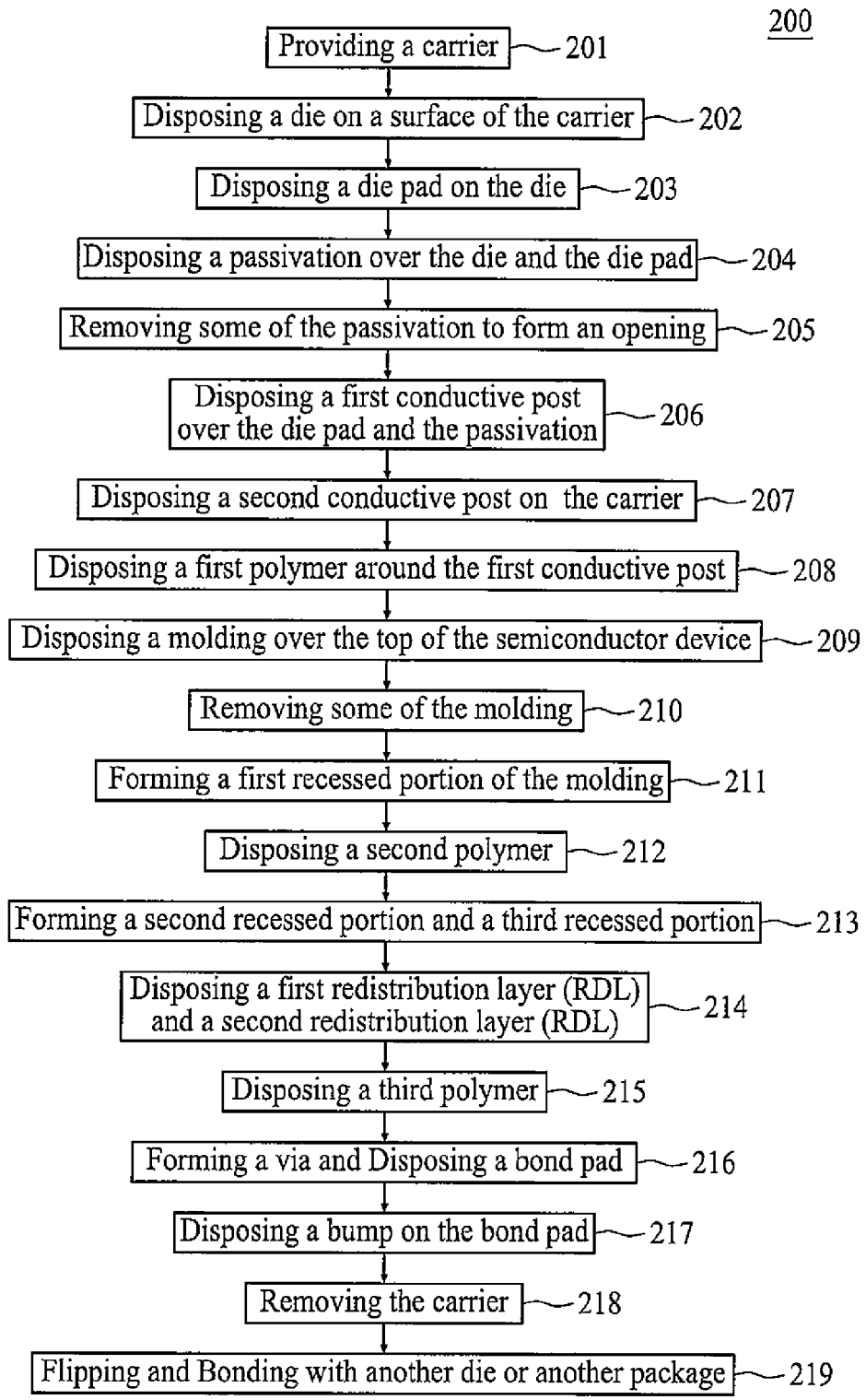
FIG. 7 is a flow diagram of a method of manufacturing a semiconductor device in accordance with some embodiments of the present disclosure.

FIG. 7 is an embodiment of a method 200 of manufacturing a semiconductor device. The method 200 includes a number of operations (201, 202, 203, 204, 205, 206, 207, 208, 209, 210, 211, 212, 213, 214, 215, 216, 217, 218 and 219).

Figure 7A:
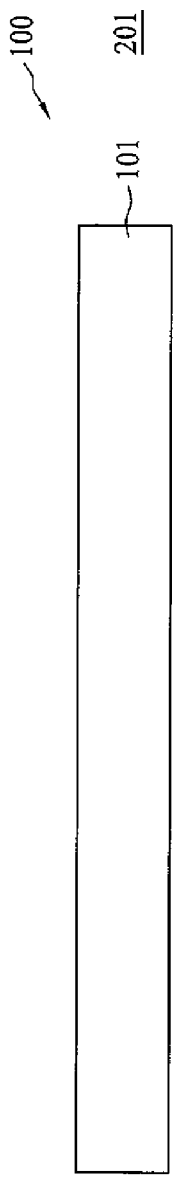
FIG. 7A is a schematic view of a semiconductor device with a carrier in accordance with some embodiments of the present disclosure.
Figure 7B:
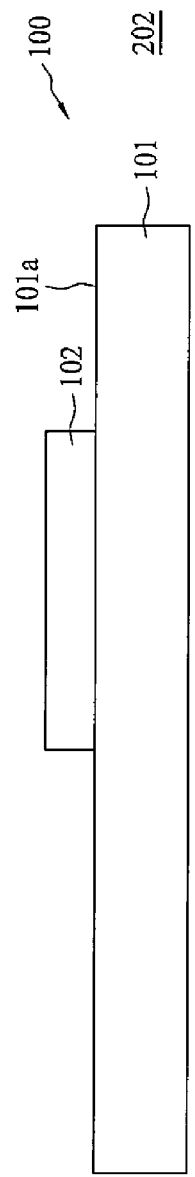
FIG. 7B is a schematic view of a semiconductor device with a die in accordance with some embodiments of the present disclosure.

In operation 201, a carrier 101 is provided as in FIG. 7A. In some embodiments, the carrier 101 includes silicon, ceramic, copper or etc. In some embodiments, the carrier 101 is in a circular shape. In operation 202, a die 102 is disposed as in FIG. 7B. In some embodiments, the die 102 is a piece including semiconductor material and is fabricated with a given functional circuit.

Figure 7C:
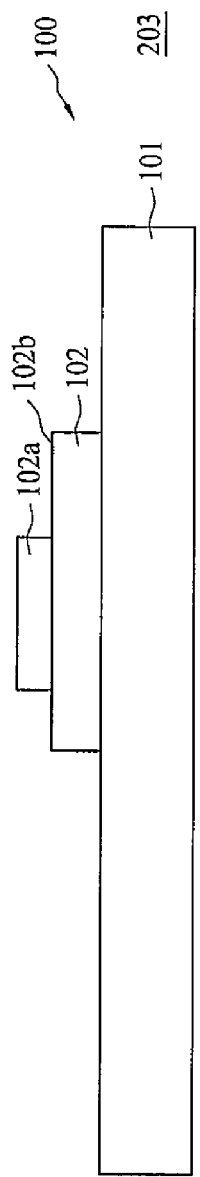
FIG. 7C is a schematic view of a semiconductor device with a die pad in accordance with some embodiments of the present disclosure.

In operation 203, a die pad 102a is disposed on the die 102 as in FIG. 7C. The die pad 102a is formed on a surface 102b of the die 102. In some embodiments, the die pad 102a is configured for electrically connecting the die 102 with a circuitry external to the die 102.

In operation 204, a passivation 103 is disposed over the die 102 and the die pad 102a as in FIG. 7D. The passivation 103 covers the die pad 102a and disposed on the surface 102b of the die 102.

In operation 205, some of the passivation 103 is removed to form an opening 103a as in FIG. 7E. In some embodiments, some of the passivation 103 above a top surface 102c of the die pad 102a is removed by etching operations to expose the top surface 102c of the die pad 102a and form the opening 103a. In some embodiments, the opening 103a is extended from a top surface 103b of the passivation 103 to the top surface 102c of the die pad 102a.

In operation 206, a first conductive post 104 is disposed over the die pad 102a and the passivation 103 as in FIG. 7F. In some embodiments, the first conductive post 104 fills the opening 103a and forms on a part of the top surface 103b of the passivation 103 adjacent to the opening 103a. In some embodiments, the first conductive post 104 is extended from an exposed portion of the top surface 102c of the die pad 102a to a top of the semiconductor device 100. In some embodiments, the first conductive post 104 is substantially upright and supported by the die pad 102a. In some embodiments, the first conductive post 104 is disposed by various methods such as electroplating, sputtering or etc. In some embodiments, the first conductive post 104 includes a metal such as copper.

In operation 207, a second conductive post 106 is disposed adjacent to the die 102 as in FIG. 7G. The second conductive post 106 is extended upright to the top of the semiconductor device 100. In some embodiments, the top surface 104a of the first conductive post 104 is at a level substantially higher than the top surface 106b of the second conductive post 106.

In some embodiments, the second conductive post 106 is disposed by various methods such as electroplating, sputtering or etc. In some embodiments, the second conductive post 106 includes a metal such as copper.

In operation 208, a first polymer 105 is disposed around the first conductive post 104 as in FIG. 7H. In some embodiments, the first polymer 105 surrounds the first conductive post 104. The first polymer 105 is configured to insulate the first conductive post 104. In some embodiments, the first polymer 105 includes a polymeric material such as epoxy, polyimide, polybenzoxazole (PBO), solder resist (SR), ABF film, and the like.

In operation 209, a molding 107 is disposed over the top of the semiconductor device 100 as in FIG. 7I. In some embodiments, the molding 107 is disposed over the first conductive post 104, the second conductive post 106 and the die 102. The molding encapsulates the first conductor post 104, the second conductive post 106, the die 102, the die pad 102a, the passivation 103 and the first polymer 105. In some embodiments, the molding 107 is configured for protecting and isolating components from the surrounding.

Figure 7J:
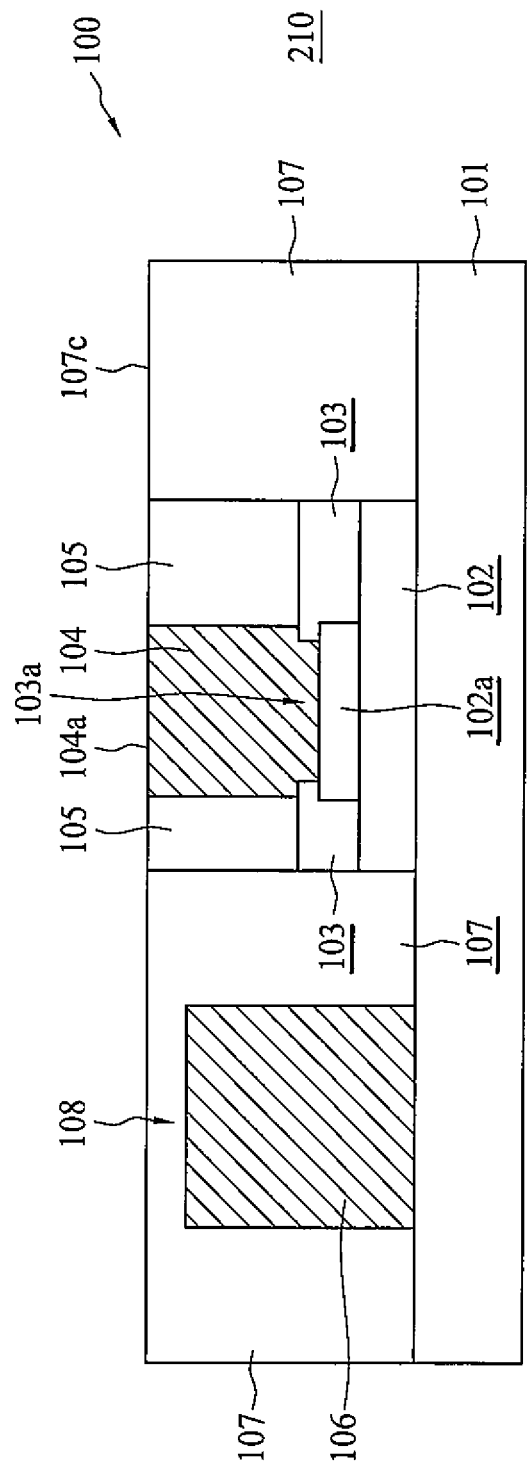
FIG. 7J is a schematic view of a semiconductor device with a ground molding in accordance with some embodiments of the present disclosure.

In operation 210, some of the molding 107 is removed as in FIG. 7J. In some embodiments, some portions of the molding 107 is removed from the top of the molding 107 by various methods such as grinding, etching or etc. In some embodiments, the molding 107 is ground along its height, such that a top surface 107c of the molding 107 is at a substantially same level as a top surface 104a of the first conductive post 104. In some embodiments, a top surface 106b of the second conductive post 106 is still covered by the molding 107 after the grinding operations.

Figure 7K:
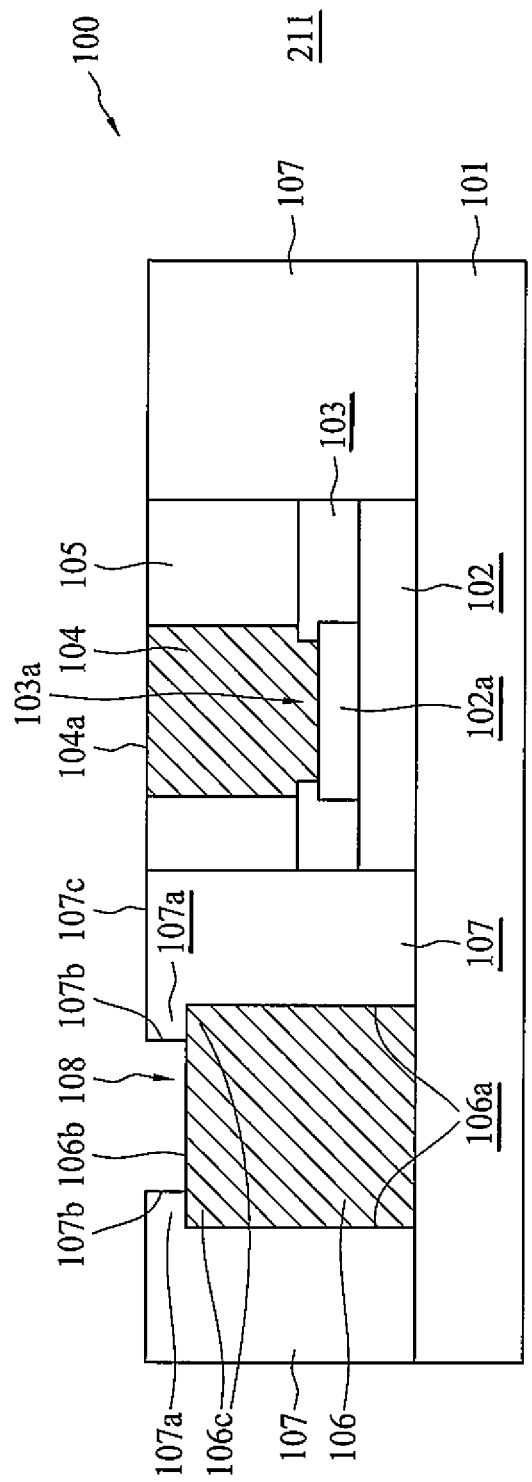
FIG. 7K is a schematic view of a semiconductor device with a first recessed portion in accordance with some embodiments of the present disclosure.

In operation 211, a first recessed portion 108 of the molding 107 is formed as in FIG. 7K. In some embodiments, the first recessed portion 108 is formed by various methods such as etching or laser drilling. Some of the molding 107 above a top surface 106b of the second conductive post 106 is removed to expose some of the top surface 106b and form a protruded portion 107a. In some embodiments, the first recessed portion 108 is extended from the top surface 107c of the molding 107 to the top surface 106b of the second conductive post 106.

In some embodiments, the protruded portion 107a is disposed adjacent to a periphery 106c of the second conductive post 106. In some embodiments, the protruded portion 107a is protruded from a sidewall 106a of the second conductive post 106. In some embodiments, the protruded portion 107a is extended from the sidewall 106a to a sidewall 107b of the protruded portion 107a of the molding 107.

Figure 7L:
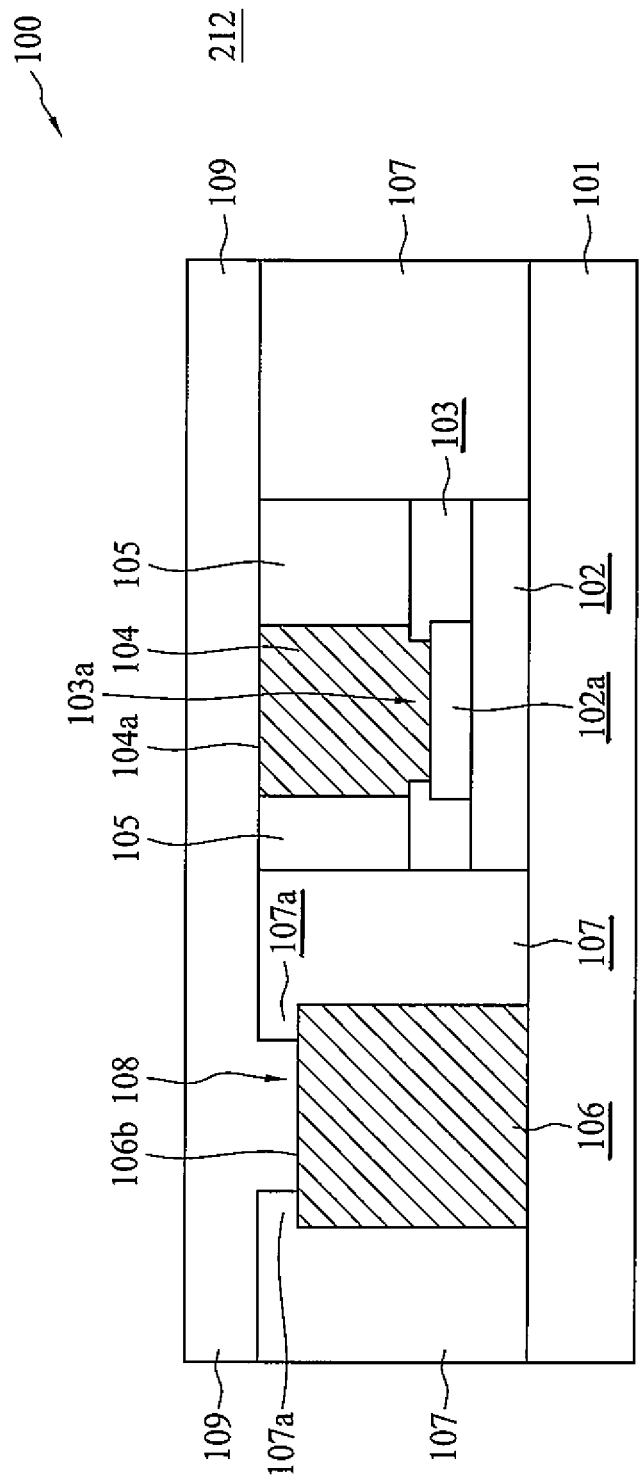
FIG. 7L is a schematic view of a semiconductor device with a second polymer in accordance with some embodiments of the present disclosure.

In operation 212, a second polymer 109 is disposed over molding 107, the first conductive post 104, the second conductive post 106 and the first polymer 105 as in FIG. 7L. In some embodiments, the second polymer 109 fills the first recessed portion 108 and covers the top of the semiconductor device 100. In some embodiments, the second polymer 109 includes a polymeric material such as epoxy, polyimide, polybenzoxazole (PBO), solder resist (SR), ABF film, and the like.

Figure 7M:
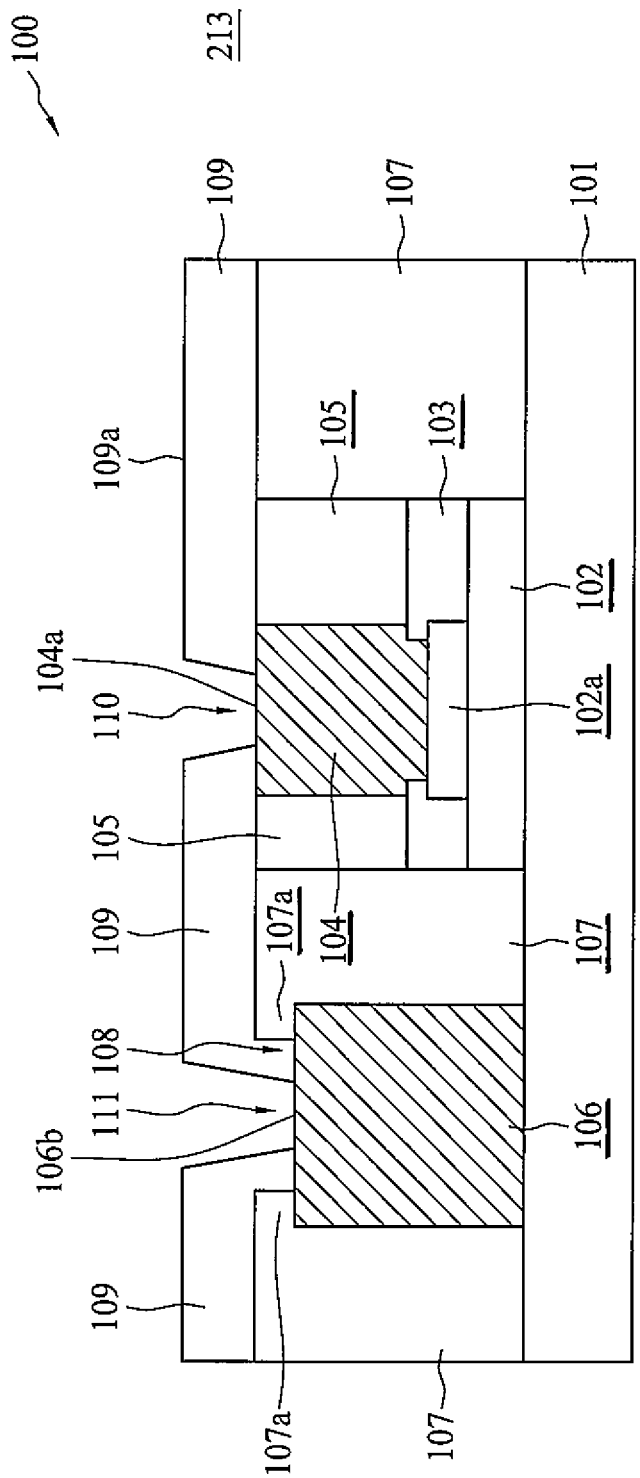
FIG. 7M is a schematic view of a semiconductor device with a second recessed portion and a third recessed portion in accordance with some embodiments of the present disclosure.

In operation 213, a second recessed portion 110 and a third recessed portion 111 are formed above the top surface 104a of the first conductive post 104 and the top surface 106b of the second conductive post 106 respectively as in FIG. 7M. In some embodiments, some of the second polymer 109 above the top surface 104a and the top surface 106b are removed by etching.

In some embodiments, the second recessed portion 110 is extended from a top surface 109a of the second polymer 109 to the top surface 104a of the first conductive post 104. In some embodiments, the third recessed portion 111 is extended from the top surface 109a of the second polymer 109 to the top surface 106b of the second conductive post 106. In some embodiments, the second recessed portion 110 and the third recessed portion 111 are respectively in a tapered configuration.

In some embodiments, the third recessed portion 111 is surrounded by the first recessed portion 108. In some embodiments, some of the second polymer 109 is surrounded by the protruded portion 107a and the first recessed portion 108. The protruded portion 107a surrounds the first recessed portion 108, some of the second polymer 109 and the third recessed portion 111.

Figure 7N:
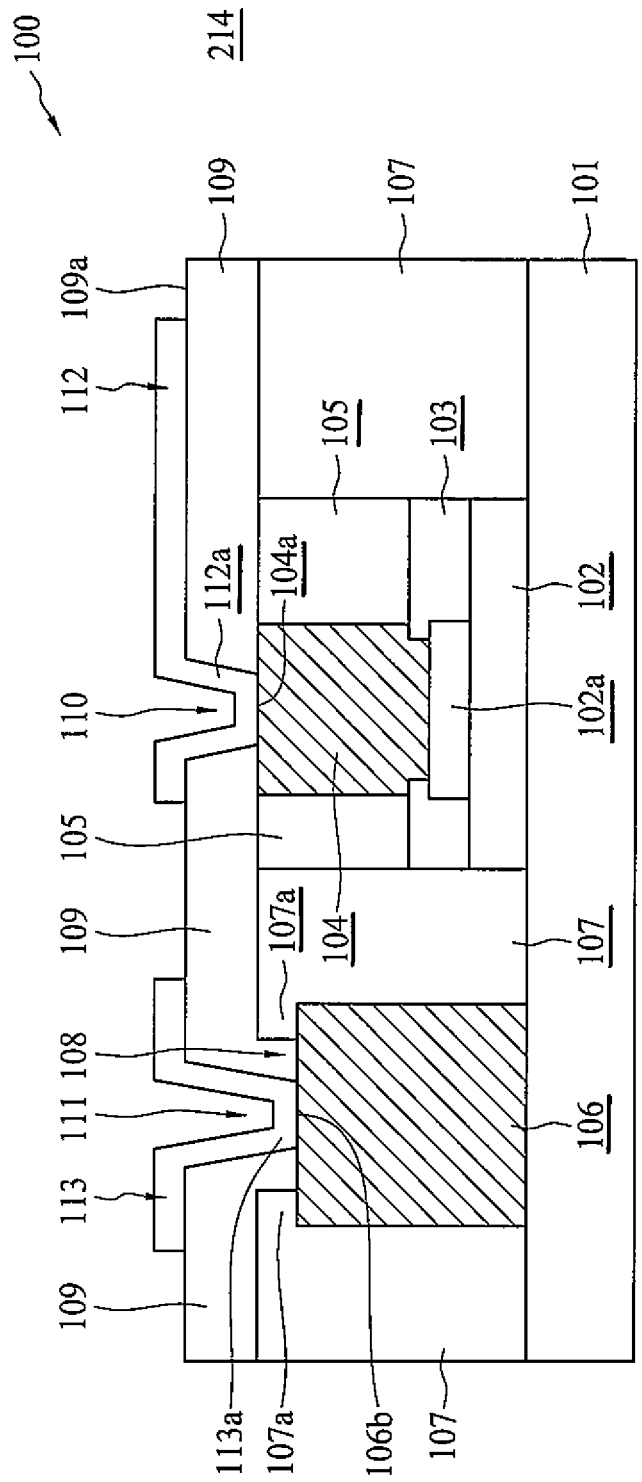
FIG. 7N is a schematic view of a semiconductor device with a first RDL and a second RDL in accordance with some embodiments of the present disclosure.

In operation 214, a first redistribution layer (RDL) 112 and a second redistribution layer (RDL) 113 are disposed as in FIG. 7N. In some embodiments, the first RDL 112 and the second RDL 113 are disposed on the second polymer 109 by electroplating or sputtering. In some embodiments, the first RDL 112 includes a first extended portion 112a extending from the top surface 109a of the second polymer 109 to the top surface 104a of the first conductive post 104. The first extended portion 112a is disposed along the second recessed portion 110. The first RDL 112 is electrically connected with the first conductive post 104 through the top surface 104a and the first extended portion 112a.

In some embodiments, the second RDL 113 includes a second extended portion 113a extending from the top surface 109a of the second polymer 109 to the top surface 106b of the second conductive post 106. The second extended portion 113a is disposed along the third recessed portion 111. The second RDL 113 is electrically connected with the second conductive post 106 through the top surface 106b and the second extended portion 113a. In some embodiments, the second extended portion 113a is surrounded by the protruded portion 107a and the first recessed portion 108.

Figure 7P:
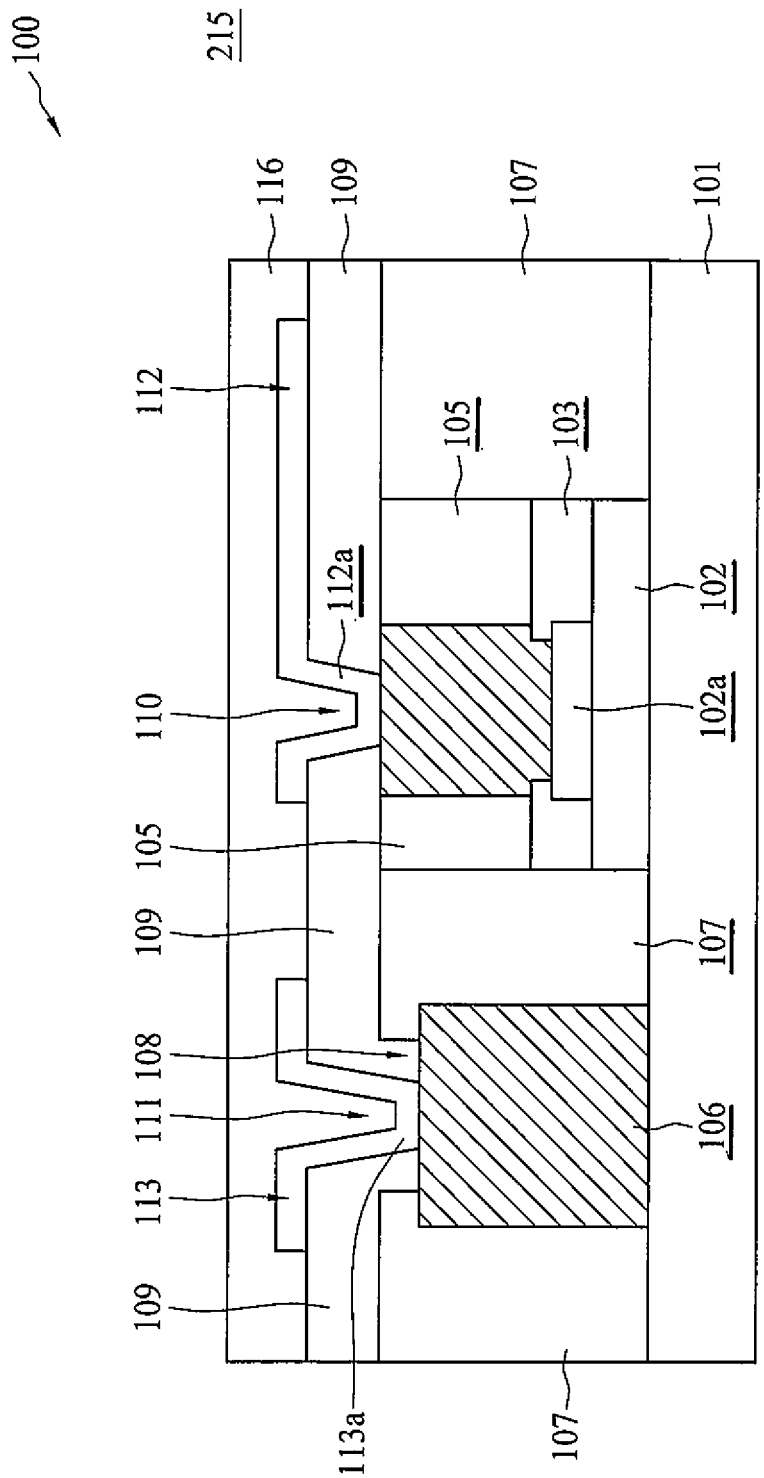
FIG. 7P is a schematic view of a semiconductor device with a third polymer in accordance with some embodiments of the present disclosure.

In operation 215, a third polymer 116 is disposed as in FIG. 7P. In some embodiments, the third polymer 116 is disposed on the first RDL 112, the second RDL 113 and the second polymer 109. The third polymer 116 covers the top of the semiconductor device 100. In some embodiments, the third polymer 116 includes a polymeric material such as epoxy, polyimide, polybenzoxazole (PBO), solder resist (SR), ABF film, and the like.

Figure 7Q:
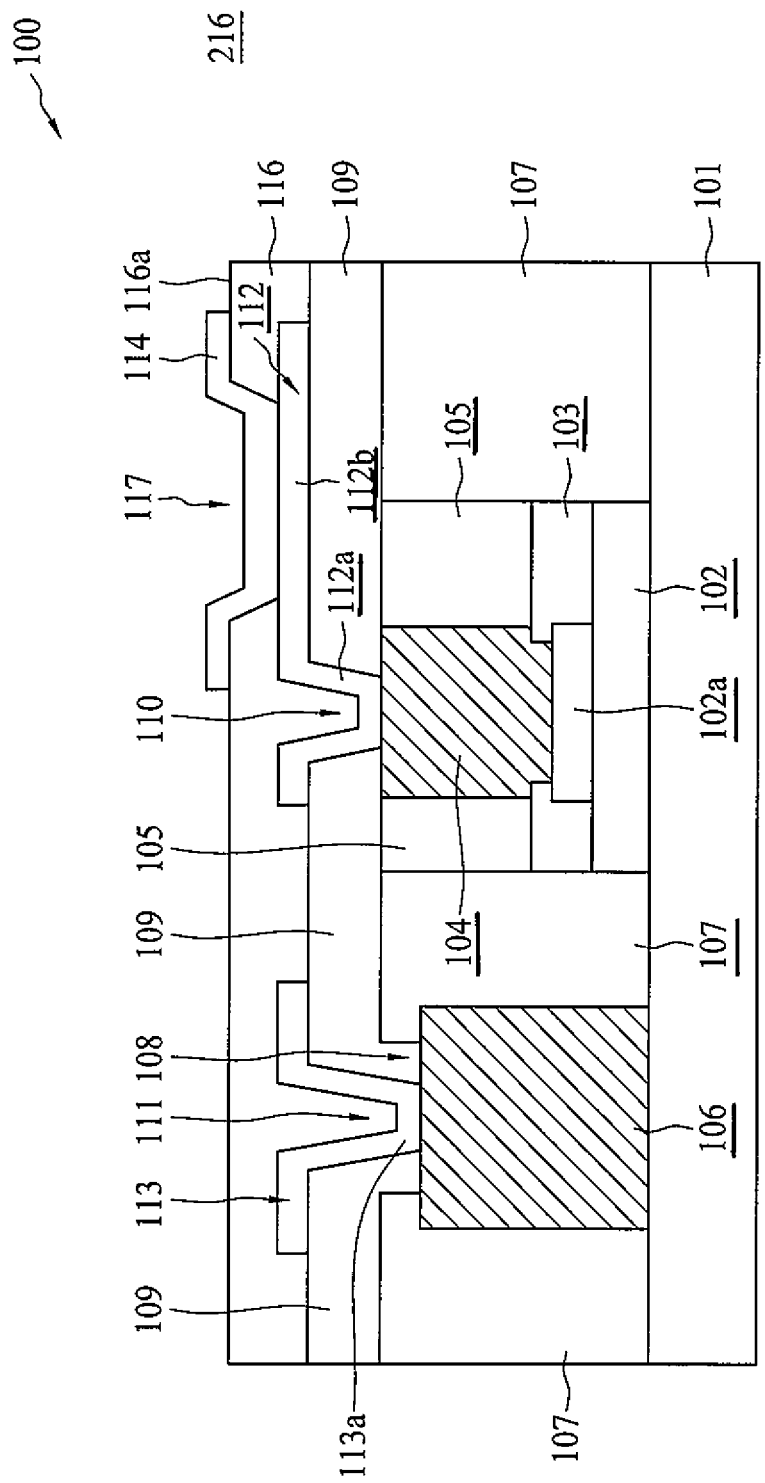
FIG. 7Q is a schematic view of a semiconductor device with a bond pad in accordance with some embodiments of the present disclosure.

In operation 216, a via 117 is formed and a bond pad 114 is disposed as in FIG. 7Q. In some embodiments, the via 117 is formed by removing some of the third polymer 116 above the first RDL 112. In some embodiments, some of the third polymer 116 is removed by etching to form the via 117. In some embodiments, the via 117 is in a tapered configuration. In some embodiments, the via 117 is extended from a top surface 116a of the third polymer 116 to an end portion 112b of the first RDL 112.

In some embodiments, the bond pad 114 is formed above the end portion 112b of the first RDL 112 and the third polymer 116. In some embodiments, the bond pad 114 fills the via 117 and extends from the top surface 116a of the third polymer 116 to the end portion 112b of the first RDL 112, so that the bond pad 114 is electrically connected with the first RDL 112. In some embodiments, the bond pad 114 is an under bump metallurgy (UBM) pad which is a solderable surface for receiving a bump and electrically connecting the bond pad 114 with the circuitry external to the die 102.

Figure 7R:
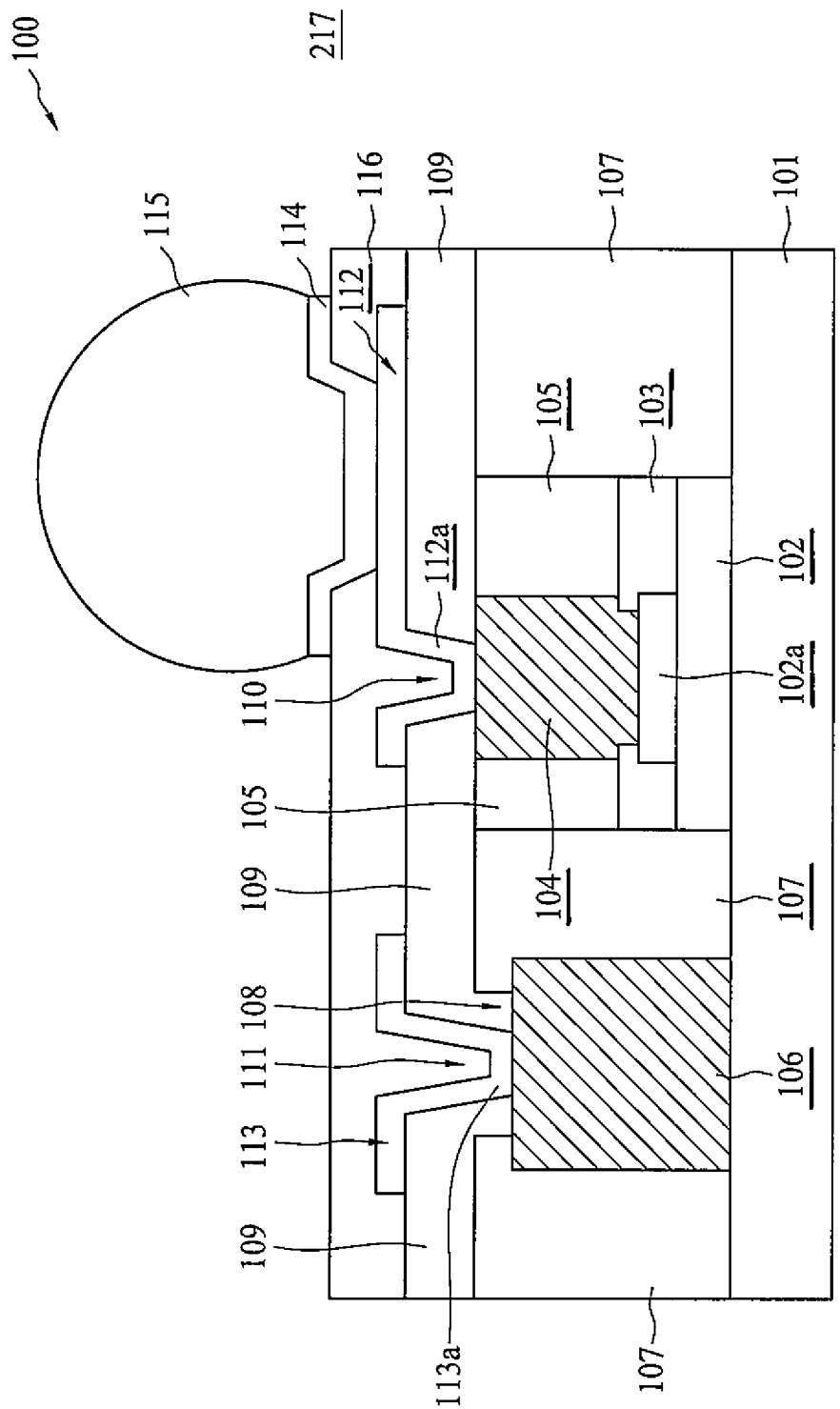
FIG. 7R is a schematic view of a semiconductor device with a bump in accordance with some embodiments of the present disclosure.

In operation 217, a bump 115 is disposed on the bond pad 114 as in FIG. 7R. In some embodiments, the bump 115 is a solder bump, solder ball, solder paste or etc. In some embodiments, the bump 115 is configured for attaching with a pad on another die, another substrate or another semiconductor package. In some embodiments, the bump 115 is a conductive bump or a conductive joint. In some embodiments, the die pad 102a is electrically connected with the bump 115 through the first conductive post 104, the first RDL 112 and the bond pad 114.

Figure 7S:
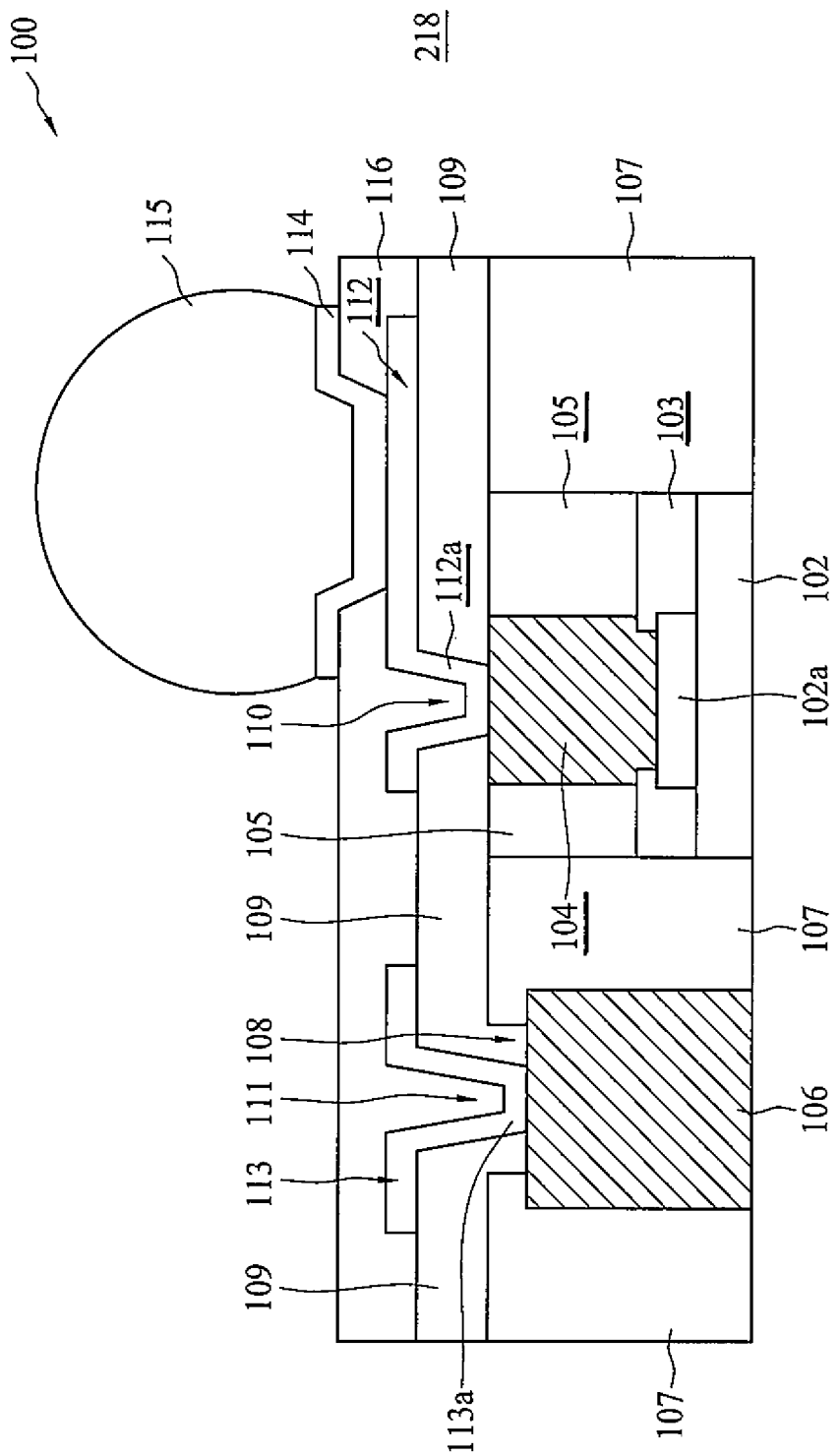
FIG. 7S is a schematic view of a semiconductor device without a carrier in accordance with some embodiments of the present disclosure.

In operation 218, the carrier 101 is removed from the semiconductor device 100 as in FIG. 7S. In some embodiments, the semiconductor device 100 is detached from the carrier 101 for subsequent operations.

Figure 7T:
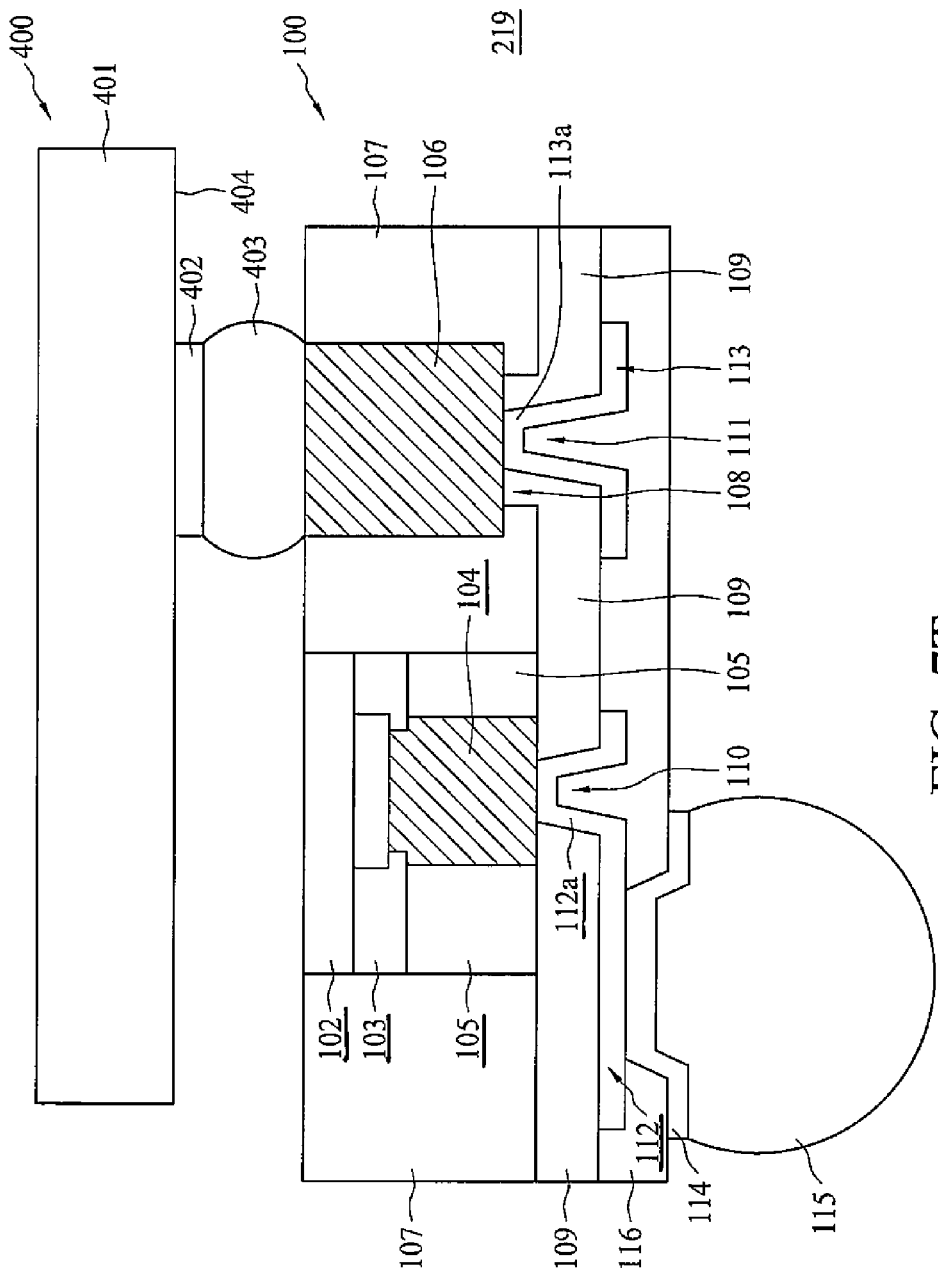
FIG. 7T is a schematic view of a semiconductor device bonding with another die or another package in accordance with some embodiments of the present disclosure.

In operation 219, the semiconductor device 100 is flipped over and is bonded with another die or another package as in FIG. 7T. In some embodiments, the semiconductor device 100 is flipped over such that the bump 115 facing downward. In some embodiments, the semiconductor device 100 is bonded with another die 401 by a die bump 403 to become a semiconductor package 400. The semiconductor device 100 is electrically connected with the die 401 by bonding a die pad 402 on the die 401 with the second conductive post 106 through the die pump 403, In some embodiments, the die 401 includes several die pads 402, so that the die pads 402 are correspondingly bonded with several conductive members of the semiconductor device 100 through several die bumps 403.

In some embodiments, the semiconductor device 100 is bonded with another package by a package bump to become a package on package (PoP). In some embodiments, the semiconductor device 100 is electrically connected with another package by bonding the second conductive post 106 with a package pad on another package through the package bump. In some embodiments, several conductive members of the semiconductor device 100 are correspondingly bonded with several package pads of another package through several package bumps to become PoP.

Figure 8:
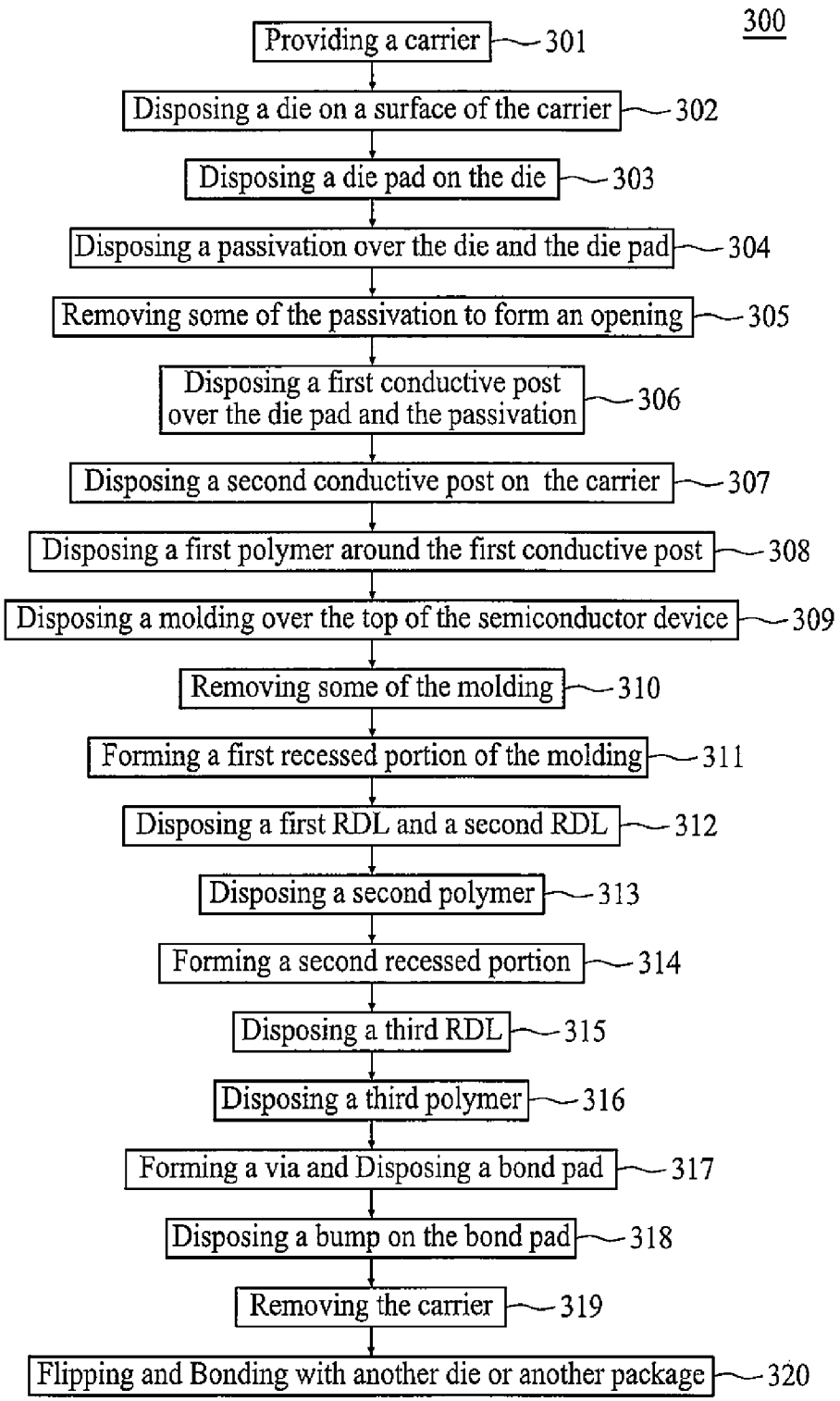
FIG. 8 is a flow diagram of a method of manufacturing a semiconductor device in accordance with some embodiments of the present disclosure.
Figure 8A:
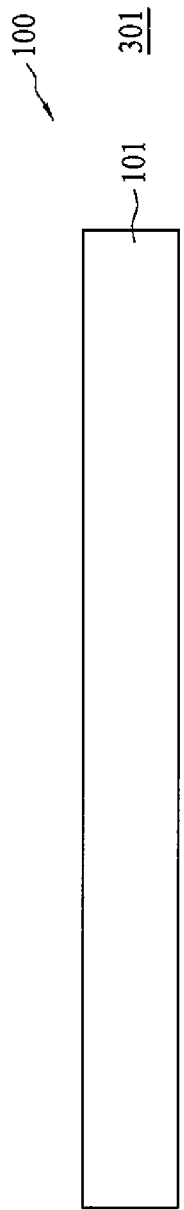
FIG. 8A is a schematic view of a semiconductor device with a carrier in accordance with some embodiments of the present disclosure.
Figure 8B:
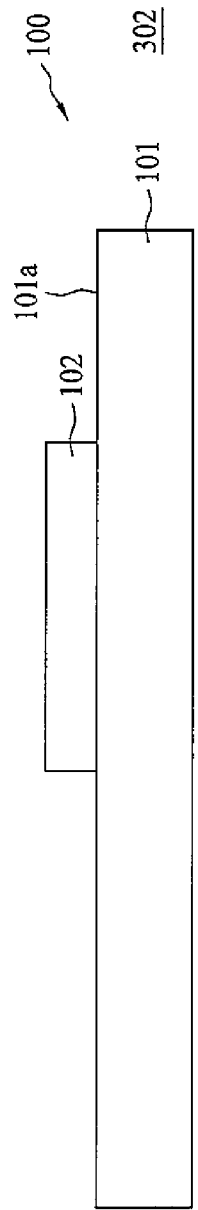
FIG. 8B is a schematic view of a semiconductor device with a die in accordance with some embodiments of the present disclosure.
Figure 8C:
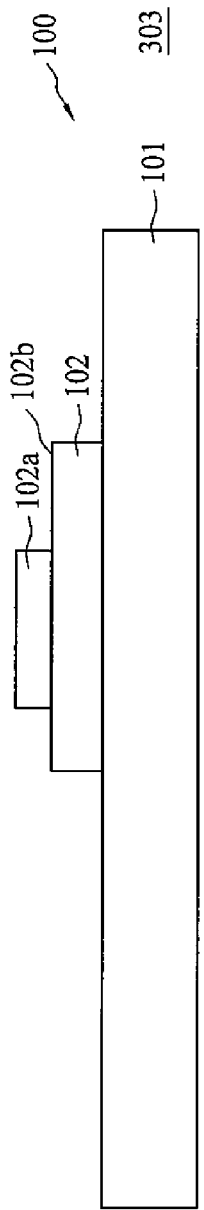
FIG. 8C is a schematic view of a semiconductor device with a die pad in accordance with some embodiments of the present disclosure.
Figure 8J:
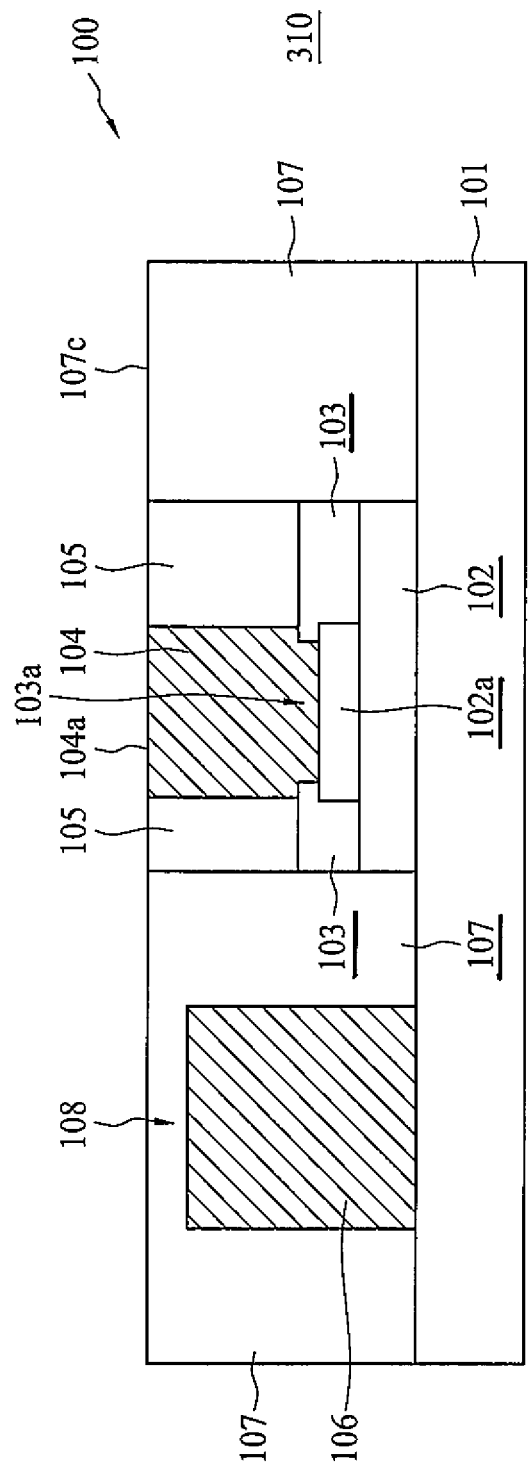
FIG. 8J is a schematic view of a semiconductor device with a ground molding in accordance with some embodiments of the present disclosure.
Figure 8K:
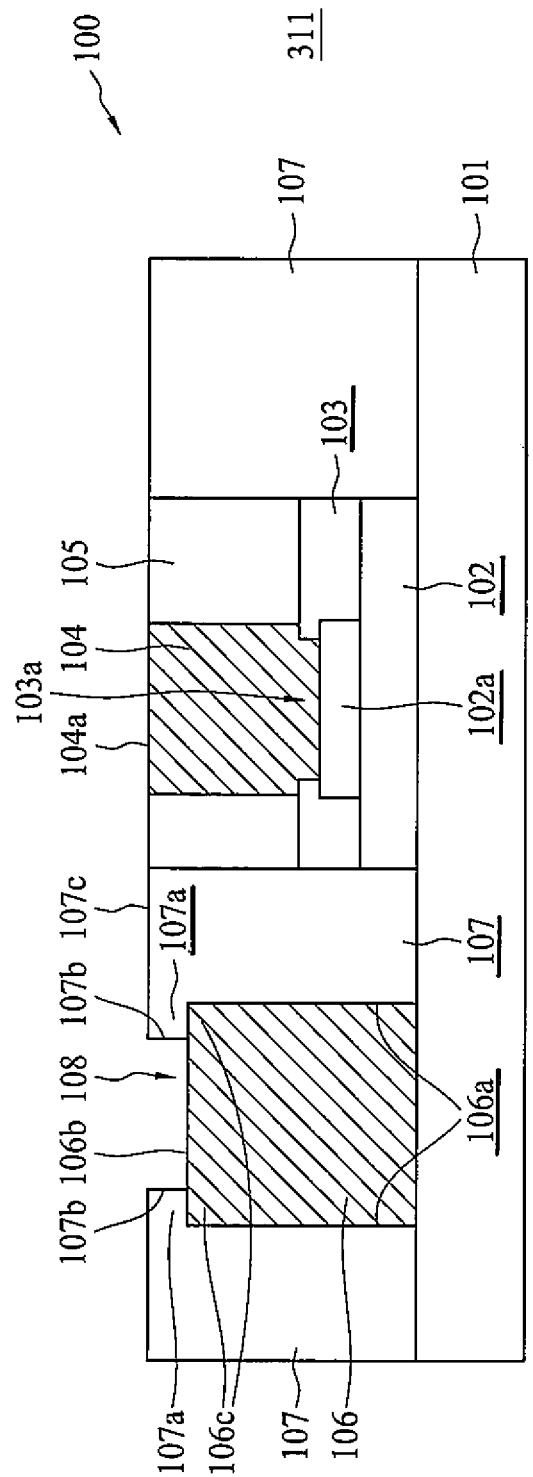
FIG. 8K is a schematic view of a semiconductor device with a first recessed portion in accordance with some embodiments of the present disclosure.

FIG. 8 is an embodiment of a method 300 of manufacturing a semiconductor device. The method 300 includes a number of operations (301, 302, 303, 304, 305, 306, 307, 308, 309, 310, 311, 312, 313, 314, 315, 316, 317, 318, 319 and 320). In some embodiments, the operations 301-311 in FIG. 8A-8K are similar to the operations 201-211 in FIG. 7A-7K respectively.

Figure 8L:
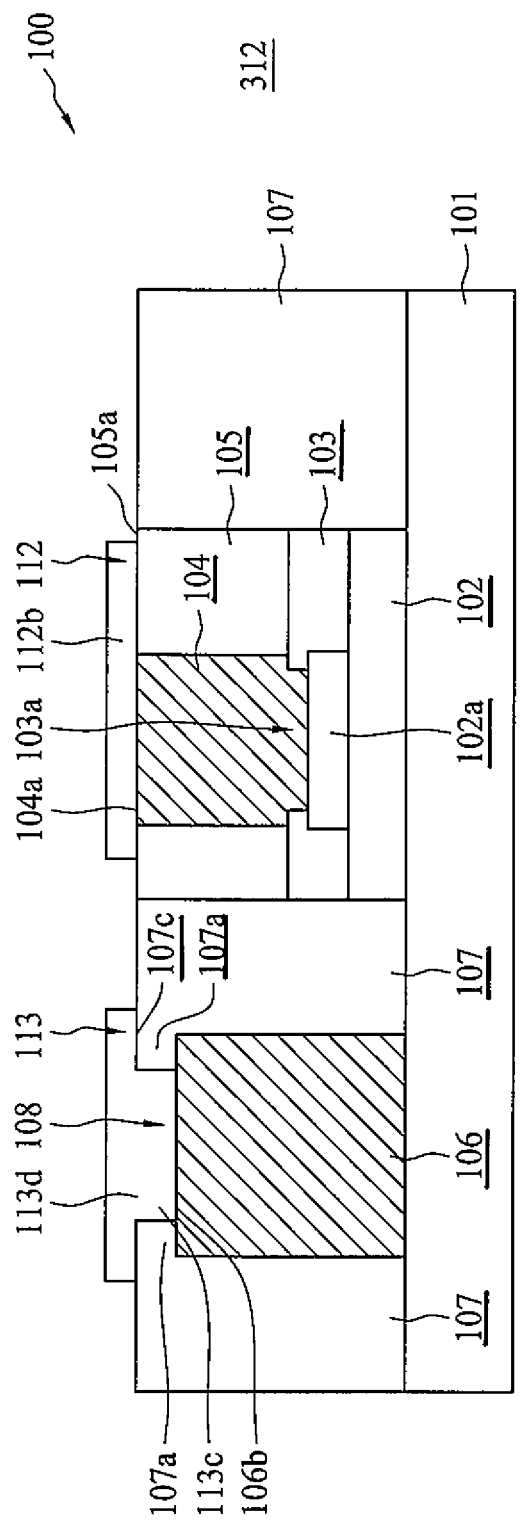
FIG. 8L is a schematic view of a semiconductor device with a first RDL and a second RDL in accordance with some embodiments of the present disclosure.

In operation 312, a first RDL 112 and a second RDL 113 are disposed on the top surface 104a of the first conductive post 104 and the top surface 106b of the second conductive post 106 respectively as in FIG. 8L. In some embodiments, the first RDL 112 and the second RDL 113 are disposed by electroplating or sputtering.

In some embodiments, an end portion 112b of the first RDL 112 is directly attached to the top surface 104a, and the first RDL 112 is extended parallel to the top surface 104a and is disposed on the top surface 104a and a top surface 105a of the first polymer 105. In some embodiments, the first recessed portion 108 is filled by a portion 113c of the second RDL 113. The portion 113c is extended from the top surface 107c of the molding 107 to the top surface 106b of the second conductive post 106. In some embodiments, an elongated portion 113d of the second RDL 113 is disposed above the portion 113c and on the molding 107. In some embodiments, the portion 113c is centrally underneath the elongated portion 113d, so that the second RDL 113 is in a T shape.

Figure 8M:
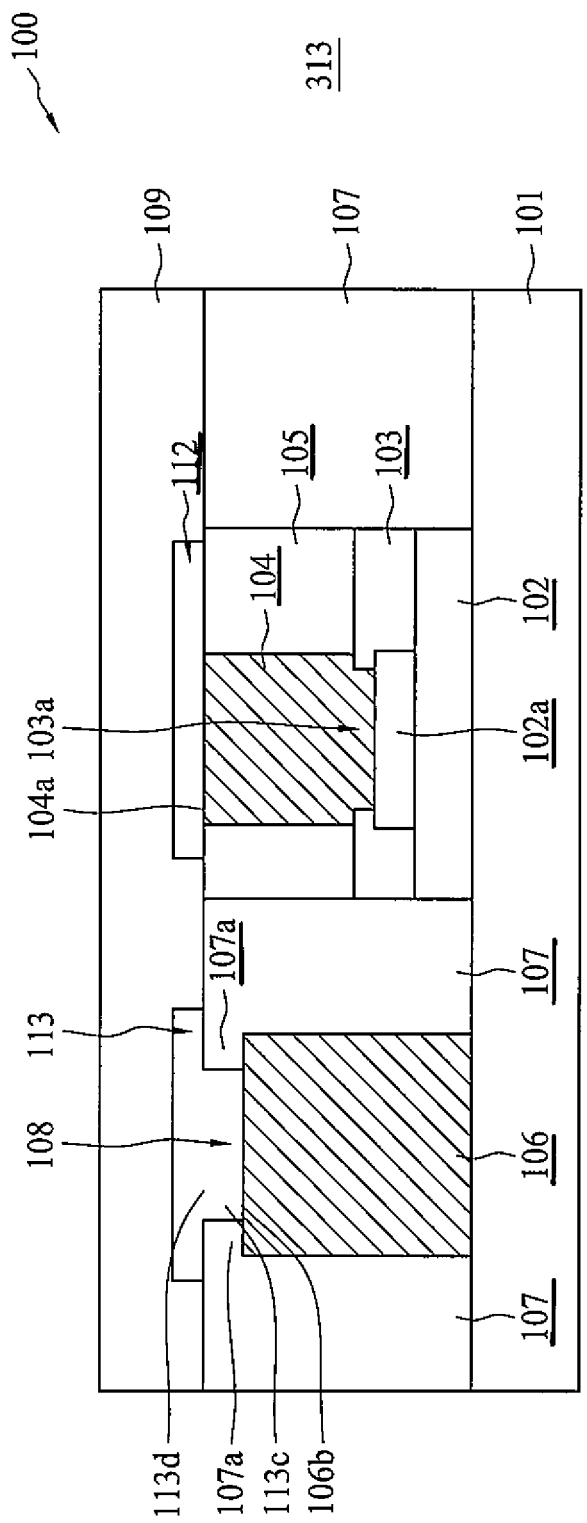
FIG. 8M is a schematic view of a semiconductor device with a second recessed portion and a third recessed portion in accordance with some embodiments of the present disclosure.

In operation 313, a second polymer 109 is disposed as in FIG. 8M. In some embodiments, the second polymer 109 covers the first RDL 112, the second RDL 113, the molding 107 and the first polymer 105.

Figure 8N:
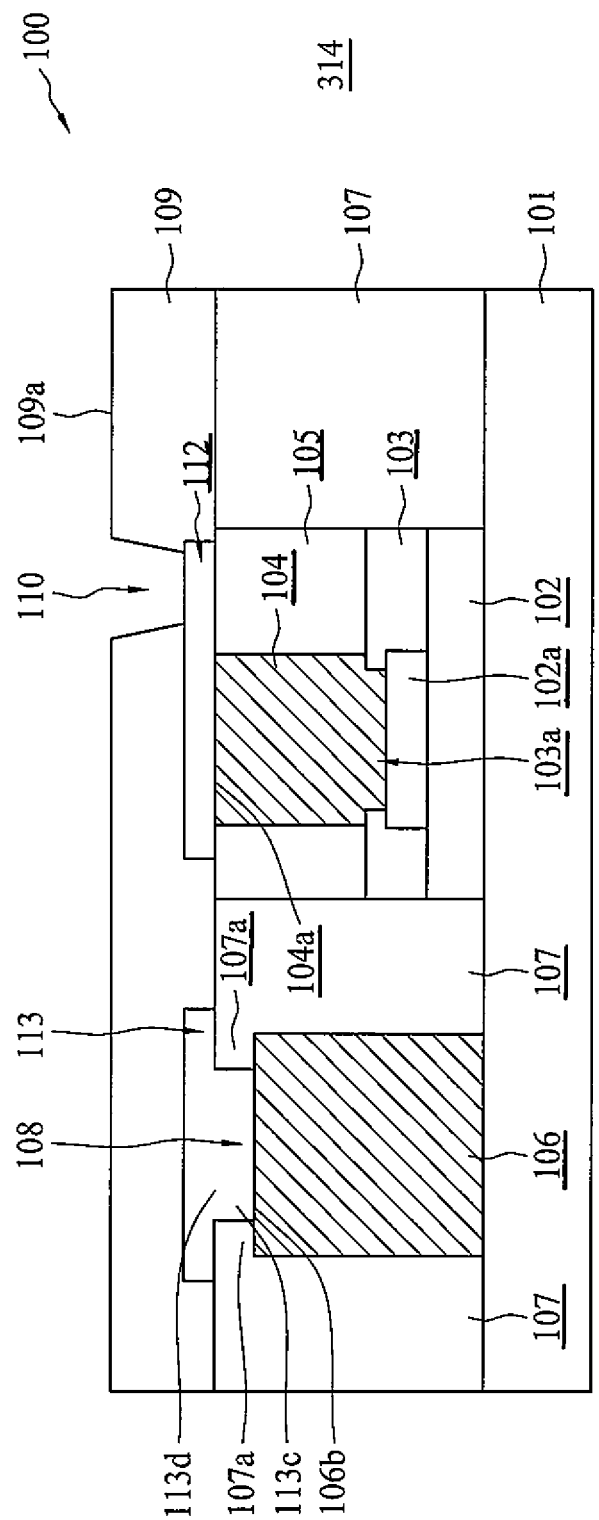
FIG. 8N is a schematic view of a semiconductor device with a second recessed portion in accordance with some embodiments of the present disclosure.

In operation 314, a second recessed portion 110 is formed as in FIG. 8N. In some embodiments, the second recessed portion 110 is formed by etching. In some embodiments, the second recessed portion 110 is extended from the top surface 109a of the second polymer 109 to the first RDL 112.

Figure 8P:
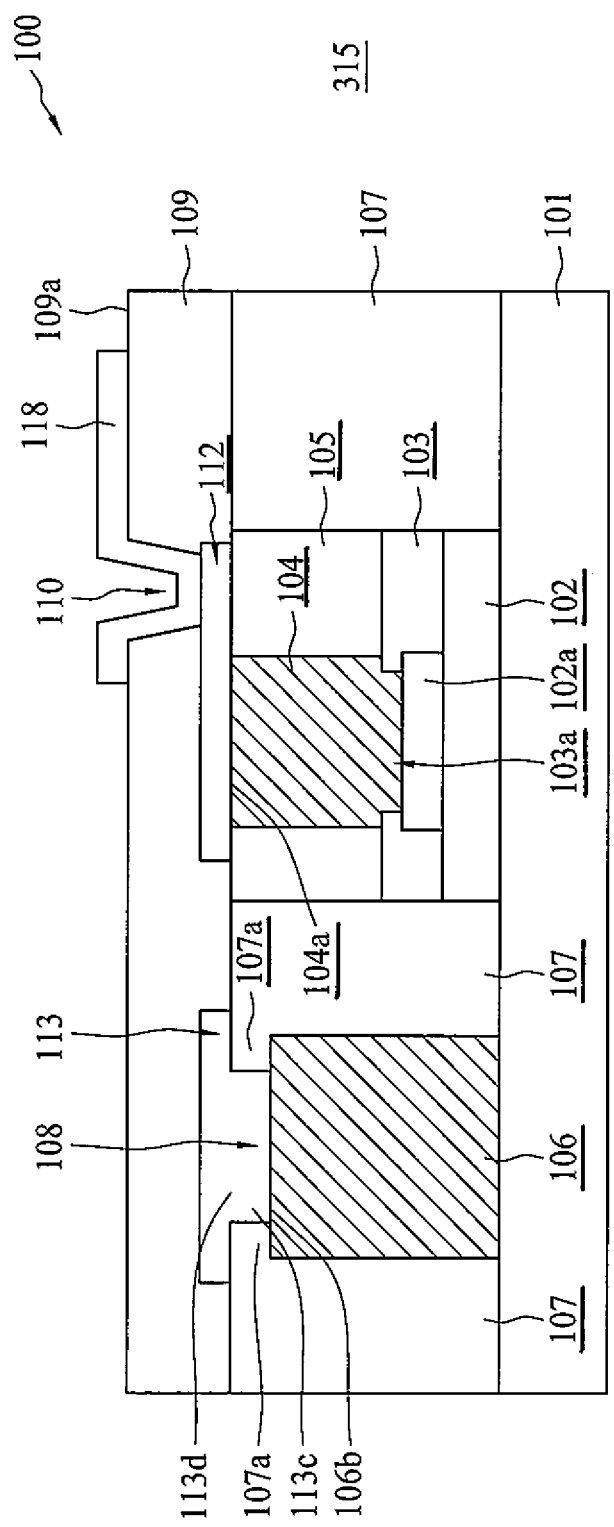
FIG. 8P is a schematic view of a semiconductor device with a third RDL in accordance with some embodiments of the present disclosure.

In operation 315, a third RDL 118 is disposed on the second polymer 109 and the first RDL 112 as in FIG. 8P. In some embodiments, the third RDL 118 is disposed by electroplating or sputtering. The third RDL 118 is disposed within the second recessed portion 110 and on the top surface 109a of the second polymer 109.

Figure 8Q:
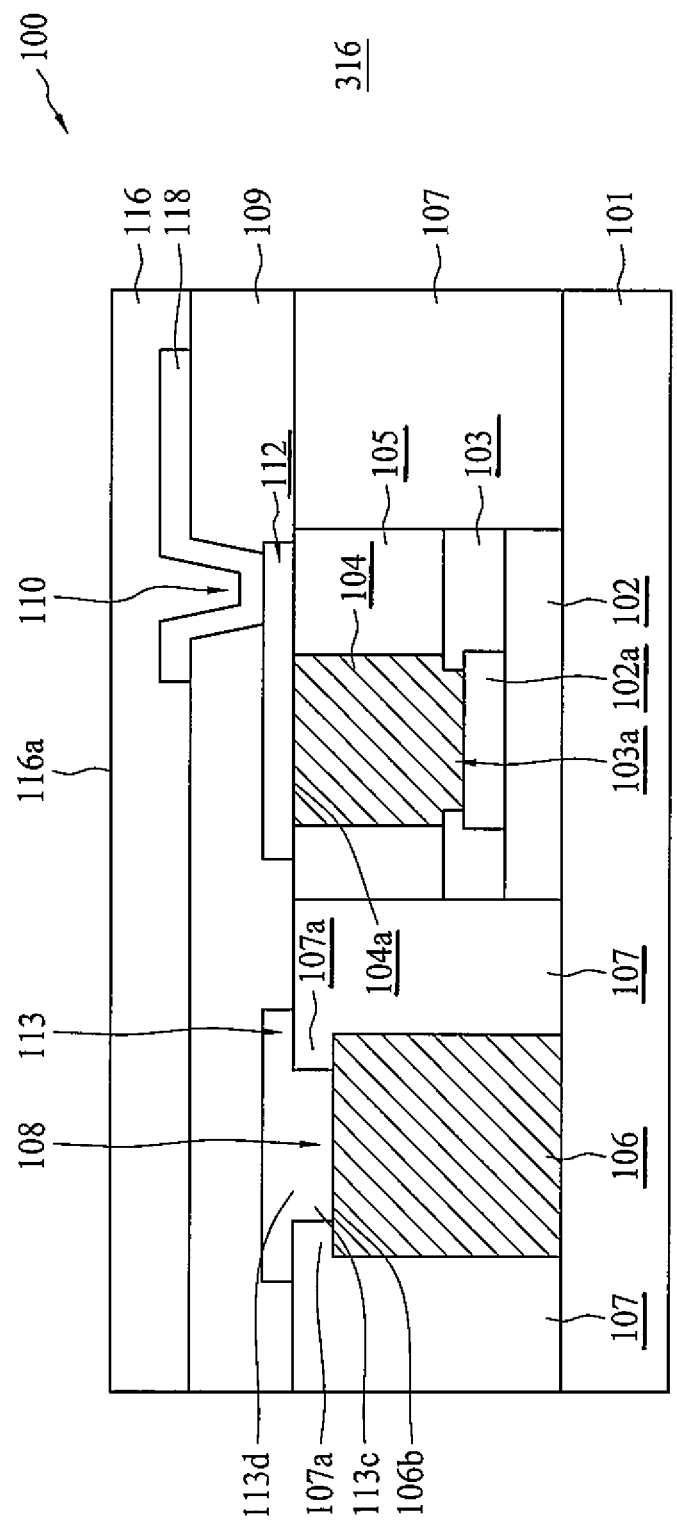
FIG. 8Q is a schematic view of a semiconductor device with a third polymer in accordance with some embodiments of the present disclosure.
Figure 8R:
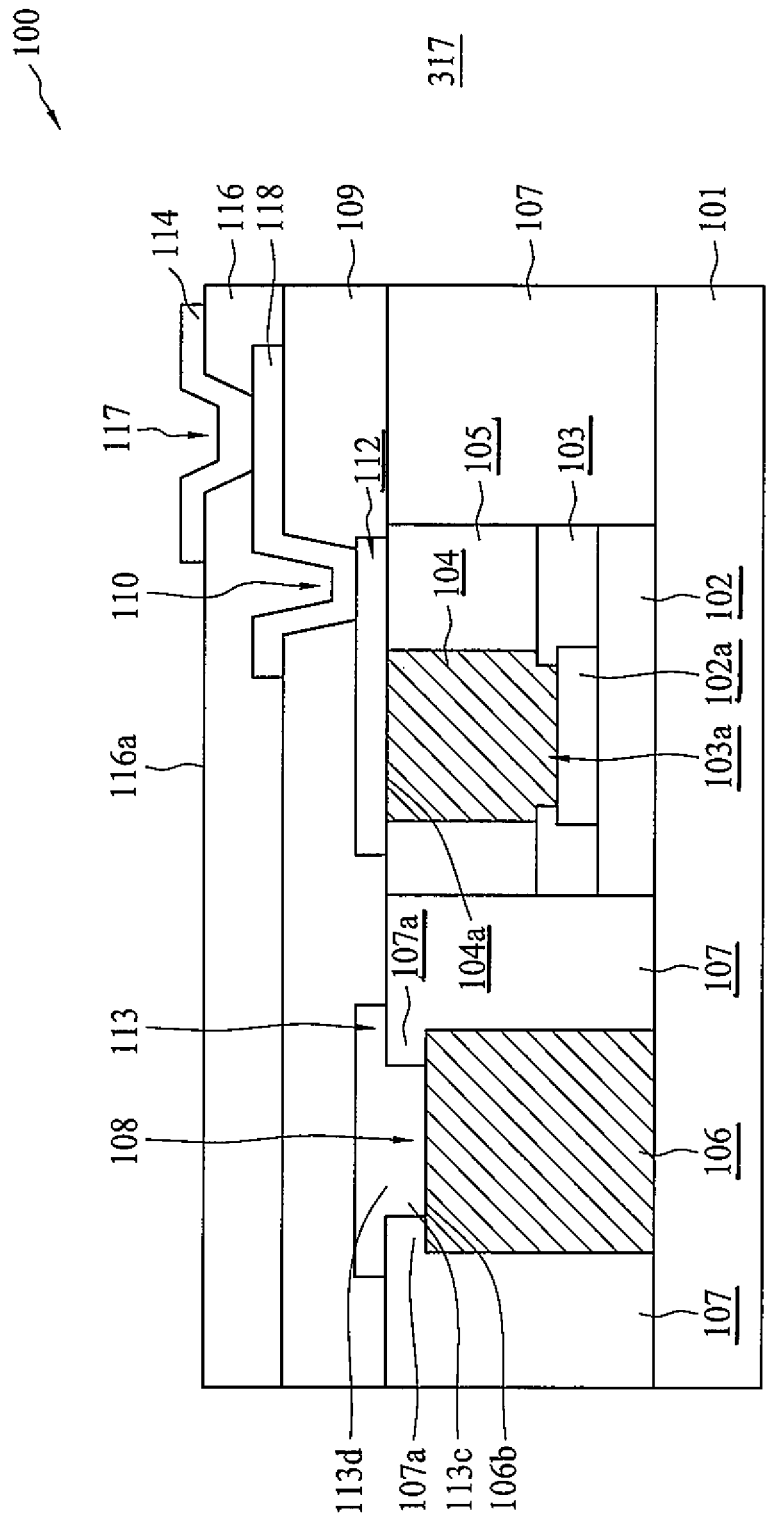
FIG. 8R is a schematic view of a semiconductor device with a bond pad in accordance with some embodiments of the present disclosure.
Figure 8S:
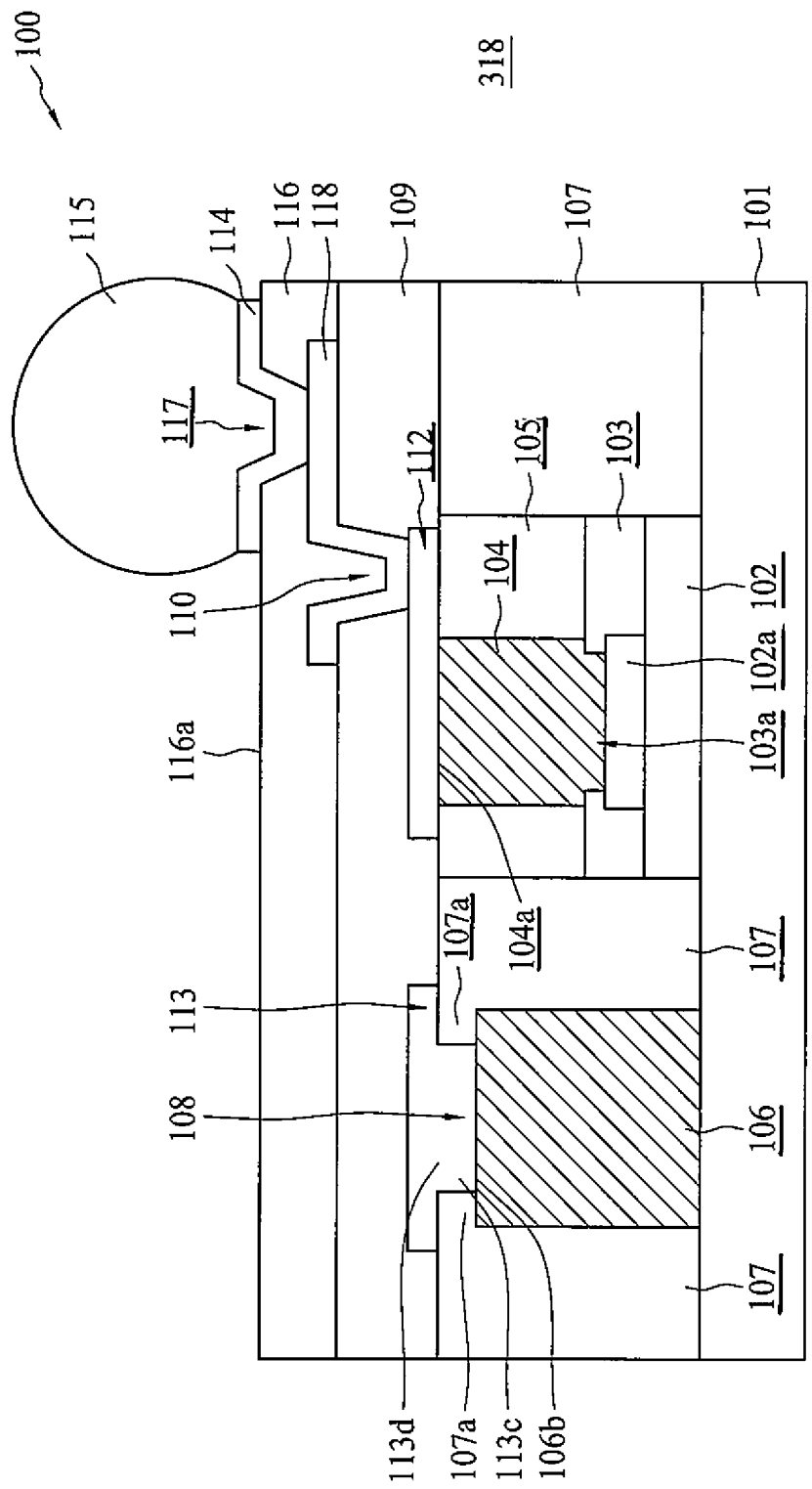
FIG. 8S is a schematic view of a semiconductor device with a bump in accordance with some embodiments of the present disclosure.

In operation 316, a third polymer 116 is disposed as in FIG. 8Q. The operation 316 is similar to the operation 215 in FIG. 7P. In operation 317, a via 117 is formed and a bond pad 114 is disposed as in FIG. 8R. The operation 317 is similar to the operation 216 in FIG. 7Q. In operation 318, a bump 115 is disposed on the bond pad 114 as in FIG. 8S. The operation 318 is similar to the operation 217 in FIG. 7R.

Figure 8T:
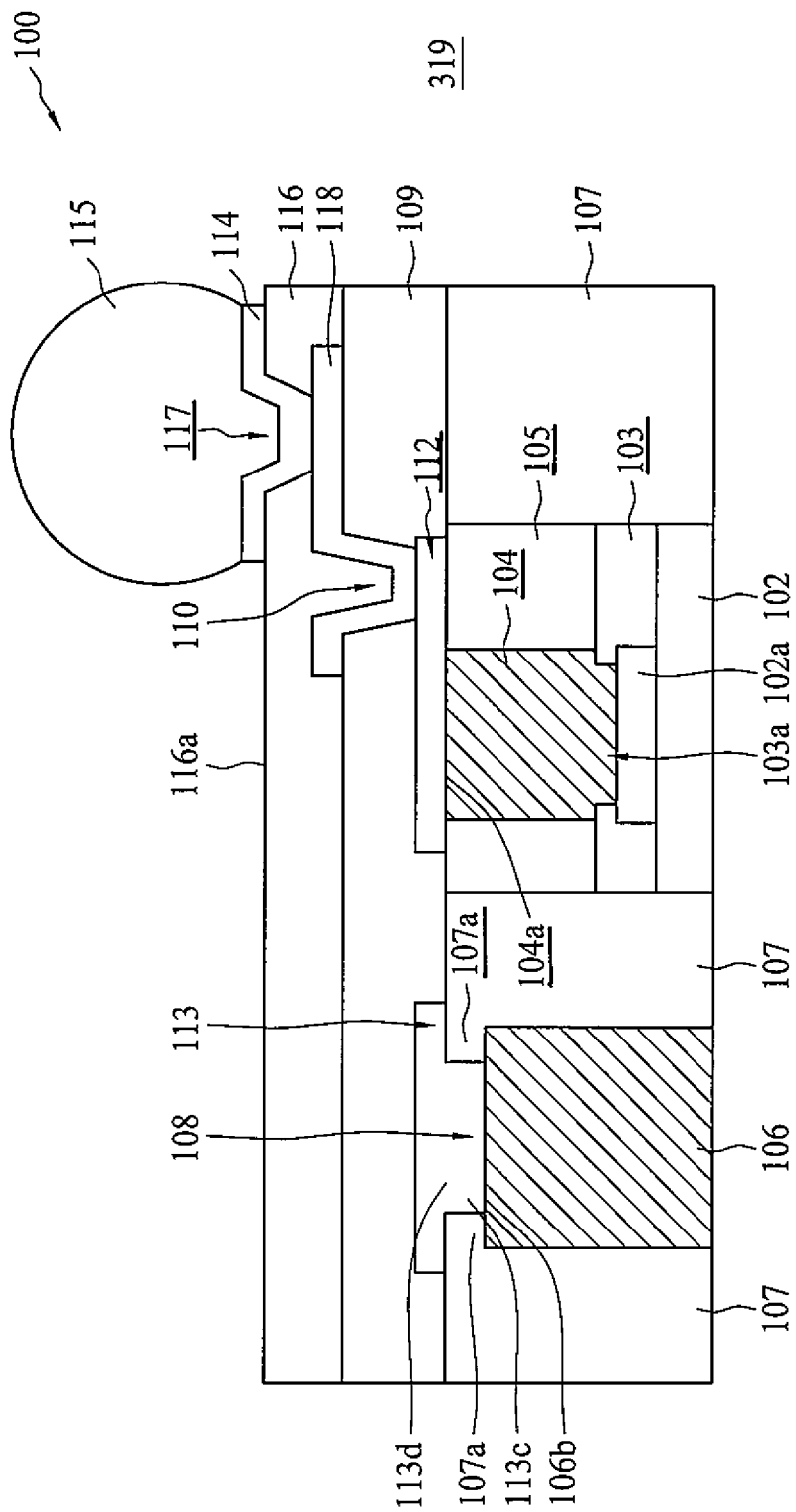
FIG. 8T is a schematic view of a semiconductor device without a carrier in accordance with some embodiments of the present disclosure.
Figure 8U:
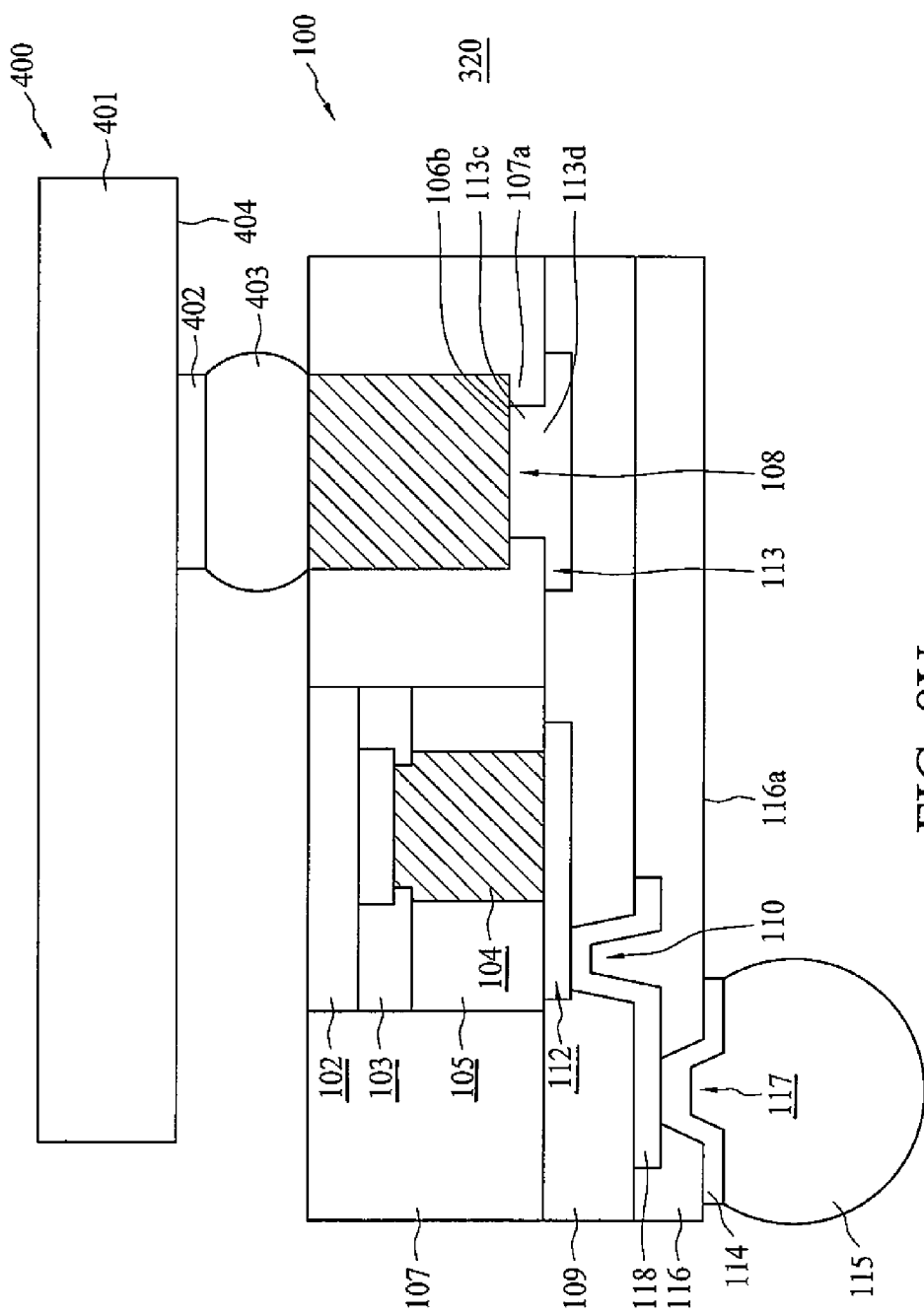
FIG. 8U is a schematic view of a semiconductor device bonding with another die or another package in accordance with some embodiments of the present disclosure.

In operation 319, the carrier 101 is removed from the semiconductor device 100 as in FIG. 8T. The operation 319 is similar to the operation 218 in FIG. 7S. In operation 320, the semiconductor device 100 is flipped over and is bonded with another die or another package as in FIG. 8U. The operation 320 is similar to the operation 219 in FIG. 7T.

In some embodiments, a semiconductor device includes a die, a conductive post disposed adjacent to the die, and a molding surrounding the conductive post and the die, the molding includes a protruded portion protruded from a sidewall of the conductive post and disposed on a top surface of the conductive post.

In some embodiments, a top surface of the molding is at a level substantially higher than the top surface of the conductive post. In some embodiments, the protruded portion of the molding includes a recessed portion extending from a top surface of the molding towards the top surface of the conductive post. In some embodiments, an angle interior to the conductive post between the top surface of the conductive post and the sidewall of the conductive post is about 30 degrees to about 130 degrees.

In some embodiments, the protruded portion of the molding is in a stepped configuration. In some embodiments, the molding has a height of about 50 um to about 500 um. In some embodiments, the top surface of the conductive post is in a convex shape towards a top surface of the molding or in a concaved shape towards a bottom surface of the conductive post.

In some embodiments, the protruded portion of the molding is protruded about 10 um to about 50 um from the sidewall of the conductive post. In some embodiments, the protruded portion of the molding surrounds a portion of a redistribution layer (RDL) electrically coupled with the conductive post. In some embodiments, the conductive post is in a circular or an elliptical shape.

In some embodiments, a semiconductor device includes a die, a first conductive post disposed on a pad of the die, a first redistribution layer (RDL) disposed on the first conductive post and including a first extended portion coupled with a top surface of the first conductive post, a second conductive post disposed adjacent to the die, a molding including a recessed portion and surrounding the second conductive post and the die, and a second redistribution layer (RDL) including a second extended portion coupled with a top surface of the second conductive post and surrounded by the recessed portion of the molding.

In some embodiments, a height of the second extended portion of the second RDL is substantially greater than a height of the first extended portion of the first RDL. In some embodiments, a width of the second conductive post is substantially greater than a width of the second extended portion of the second RDL. In some embodiments, the recessed portion of the molding surrounds a portion of a polymer. In some embodiments, the polymer surrounds the first extended portion of the first RDL or the second extended portion of the second RDL.

In some embodiments, a method of manufacturing a semiconductor device includes disposing a die, disposing a conductive post adjacent to the die, disposing a molding over the conductive post and the die, removing some portions of the molding from a top of the molding, and forming a recess of the molding above a top surface of the conductive post.

In some embodiments, the recess has a width smaller than a width of the conductive post. In some embodiments, the recess of the molding is formed by laser drilling. In some embodiments, some portions of the molding is removed by grinding. In some embodiments, the method further includes disposing a conductive material or a polymeric material within the recess to form a redistribution layer (RDL).

The methods and features of this invention have been sufficiently described in the above examples and descriptions. It should be understood that any modifications or changes without departing from the spirit of the invention are intended to be covered in the protection scope of the invention.

Moreover, the scope of the present application in not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein maybe utilized according to the present disclosure.

Accordingly, the appended claims are intended to include within their scope such as processes, machines, manufacture, compositions of matter, means, methods or steps. In addition, each claim constitutes a separate embodiment, and the combination of various claims and embodiments are within the scope of the invention.

What is claimed is:

1. A semiconductor device, comprising:
   a die;
   a conductive post disposed adjacent to the die; and
   a molding surrounding the conductive post and the die, wherein the molding includes a protruded portion protruded from a sidewall of the conductive post, disposed on a top surface of the conductive post, and surrounding a portion of a redistribution layer (RDL) electrically coupled with the conductive post.

2. The semiconductor device of claim 1, wherein a top surface of the molding is at a level substantially higher than the top surface of the conductive post.

3. The semiconductor device of claim 1, wherein the protruded portion of the molding includes a recessed portion extending from a top surface of the molding towards the top surface of the conductive post.

4. The semiconductor device of claim 1, wherein an angle in the conductive post and between the top surface of the conductive post and the sidewall of the conductive post is about 30 degrees to about 130 degrees.

5. The semiconductor device of claim 1, wherein the protruded portion of the molding is in a stepped configuration.

6. The semiconductor device of claim 1, wherein the molding has a height of about 50 um to about 500 um.

7. The semiconductor device of claim 1, wherein the top surface of the conductive post is in a convex shape towards a top surface of the molding or in a concaved shape towards a bottom surface of the conductive post.

8. The semiconductor device of claim 1, wherein the protruded portion of the molding is protruded about 10 um to about 50 um from the sidewall of the conductive post.

9. The semiconductor device of claim 1, wherein the conductive post is in a circular or an elliptical shape.

10. A semiconductor device, comprising:
    a die;
    a first conductive post disposed on a pad of the die;
    a first redistribution layer (RDL) disposed on the first conductive post and including a first extended portion coupled with a top surface of the first conductive post;
    a second conductive post disposed adjacent to the die;
    a molding including a recessed portion and surrounding the second conductive post and the die; and
    a second redistribution layer (RDL) including a second extended portion coupled with a top surface of the second conductive post and surrounded by the recessed portion of the molding,
    wherein a width of the second conductive post is substantially greater than a width of the second extended portion of the second RDL.

11. A semiconductor device of claim 10, wherein a height of the second extended portion of the second RDL is substantially greater than a height of the first extended portion of the first RDL.

12. A semiconductor device of claim 10, wherein the recessed portion of the molding surrounds a portion of a polymer.

13. A semiconductor device of claim 12, wherein the portion of the polymer surrounds the first extended portion of the first RDL or the second extended portion of the second RDL.

14. A method of manufacturing a semiconductor device, comprising:
    disposing a die;
    disposing a conductive post adjacent to the die;
    disposing a molding over the conductive post and the die;
    removing some portions of the molding from a top of the molding;
    forming a recess of the molding above a top surface of the conductive post,
    disposing a conductive material within the recess of the molding to form a redistribution layer (RDL).

15. The method of claim 14, wherein the recess has a width smaller than a width of the conductive post.

16. The method of claim 14, wherein the recess of the molding is formed by laser drilling.

17. The method of claim 14, wherein some portions of the molding is removed by grinding.

18. The method of claim 14, wherein further comprising disposing a polymeric material within the recess.

* * * * *